(12) United States Patent
Kim et al.

(10) Patent No.: US 10,847,427 B2
(45) Date of Patent: Nov. 24, 2020

(54) SEMICONDUCTOR DEVICE

(71) Applicant: Samsung Electronics Co., Ltd., Suwon-si (KR)

(72) Inventors: Jin-Wook Kim, Hwaseong-si (KR); Ju-Youn Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 135 days.

(21) Appl. No.: 16/058,291

(22) Filed: Aug. 8, 2018

(65) Prior Publication Data

US 2019/0157165 A1    May 23, 2019

(30) Foreign Application Priority Data

Nov. 17, 2017  (KR) .................. 10-2017-0153964

(51) Int. Cl.

| H01L 29/76 | (2006.01) |
| H01L 21/8238 | (2006.01) |
| H01L 27/092 | (2006.01) |
| H01L 21/321 | (2006.01) |
| H01L 21/28 | (2006.01) |

(52) U.S. Cl.
CPC ........ *H01L 21/823842* (2013.01); *H01L 21/28088* (2013.01); *H01L 21/321* (2013.01); *H01L 21/82385* (2013.01); *H01L 21/823821* (2013.01); *H01L 21/823857* (2013.01); *H01L 27/0924* (2013.01)

(58) Field of Classification Search
None
See application file for complete search history.

(56) References Cited

U.S. PATENT DOCUMENTS

| 8,586,436 B2 * | 11/2013 | Ng .................. H01L 21/823842 |
| | | 257/369 |
| 2002/0193040 A1 | 12/2002 | Zhou |
| 2005/0156169 A1 | 7/2005 | Chu |
| 2007/0020865 A1 | 1/2007 | Chen |
| 2008/0073723 A1 | 3/2008 | Rachmady |
| 2008/0096338 A1 | 4/2008 | Zhang |
| 2009/0166743 A1 | 7/2009 | Pillarisetty |
| 2009/0206406 A1 | 8/2009 | Rachmady |
| 2010/0230658 A1 | 9/2010 | Pillarisetty |
| 2011/0140171 A1 | 6/2011 | Pillarisetty |
| 2012/0032265 A1 | 2/2012 | Simonelli |
| 2013/0017678 A1 | 1/2013 | Tsai |

(Continued)

*Primary Examiner* — Hung K Vu
(74) *Attorney, Agent, or Firm* — Myers Bigel, P.A.

(57) ABSTRACT

A semiconductor device includes a substrate including first, second, third, and fourth regions, a first gate structure on the first region, a second gate structure on the second region, a third gate structure on the third region, and a fourth gate structure on the fourth region. The first gate structure includes a first gate insulating layer, a first material layer, and a first gate electrode layer. The second gate structure includes a second gate insulating layer, a second material layer, and a second gate electrode layer. The third gate structure includes a third gate insulating layer, a third material layer, and a third gate electrode layer. The fourth gate structure includes a fourth gate insulating layer and a fourth gate electrode layer. The first, second, and third material layers have different thicknesses. The first material layer includes a lower metal layer, an upper metal layer, and a polysilicon layer therebetween.

20 Claims, 17 Drawing Sheets

(56) References Cited

U.S. PATENT DOCUMENTS

| | | |
|---|---|---|
| 2013/0313520 A1 | 11/2013 | Pillarisetty |
| 2014/0110791 A1 | 4/2014 | Clark |
| 2014/0335685 A1 | 11/2014 | Tsai |
| 2014/0363960 A1 | 12/2014 | Kim |
| 2015/0004779 A1 | 1/2015 | Zhu |
| 2015/0008533 A1 | 1/2015 | Liaw |
| 2015/0171218 A1 | 6/2015 | Steigerwald |
| 2015/0236086 A1 | 8/2015 | Colinge |
| 2015/0262828 A1 | 9/2015 | Brand |
| 2015/0357426 A1 | 12/2015 | Kim |
| 2015/0380520 A1 | 12/2015 | Colinge |
| 2016/0035631 A1 | 2/2016 | Lee |
| 2016/0118464 A1 | 4/2016 | Pillarisetty |
| 2016/0155843 A1 | 6/2016 | Steigerwald |
| 2016/0172488 A1 | 6/2016 | Oh |
| 2016/0225868 A1 | 8/2016 | Kim |
| 2016/0358921 A1 | 12/2016 | Park |
| 2017/0069634 A1 | 3/2017 | Kim |
| 2017/0092542 A1 | 3/2017 | Steigerwald |
| 2017/0104069 A1 | 4/2017 | Pillarisetty |
| 2017/0117377 A1 | 4/2017 | Colinge |

\* cited by examiner

SEMICONDUCTOR DEVICE

CROSS-REFERENCE TO RELATED APPLICATION

This application claims priority under 35 U.S.C. § 119 to Korean Patent Application No. 10-2017-0153964, filed on Nov. 17, 2017, in the Korean Intellectual Property Office, the entire contents of which are hereby incorporated by reference herein.

BACKGROUND

Technical Field

Example embodiments of the present inventive concepts relate to semiconductor devices, and, more specifically, to semiconductor devices including transistors.

Discussion of Related Art

Semiconductor devices are useful in the electronic industry because of their small size, multi-functionality, and/or low fabrication cost. Semiconductor devices have been increasingly used for high integration with the advanced development of the electronic industry. For example, semiconductor devices have been increasingly utilized for their high reliability, high speed, and/or multi-functionality. Semiconductor devices have become more complex and integrated to meet these beneficial characteristics.

As the integration density of semiconductor devices increases, there have been efforts to improve the performance of transistors by using various materials such as strained channels, high-k dielectric layers, and metal gates. However, as the size of transistors gradually decreases, the reliability and performance of integrated circuit devices utilizing these transistors can be affected.

SUMMARY

According to example embodiments of the inventive concepts, a semiconductor device may include a substrate including first, second, third, and fourth regions, a first gate structure on the first region, the first gate structure including a first gate insulating layer, a first material layer having a first thickness, and a first gate electrode layer, a second gate structure on the second region, the second gate structure including a second gate insulating layer, a second material layer having a second thickness, and a second gate electrode layer, a third gate structure on the third region, the third gate structure including a third gate insulating layer, a third material layer having a third thickness, and a third gate electrode layer, and a fourth gate structure on the fourth region, the fourth gate structure including a fourth gate insulating layer and a fourth gate electrode layer. The first, second, and third thicknesses may be different from one another. The first material layer may include a lower metal layer, an upper metal layer, and a polysilicon layer between the lower metal layer and the upper metal layer.

According to example embodiments of the inventive concepts, a semiconductor device may include a substrate including a first region, a second region, a third region, and a fourth region, a gate insulating layer on the first to fourth regions, a first work function adjusting layer and a polysilicon layer on the first region, a second work function adjusting layer on the first and second regions, a third work function adjusting layer on the first to third regions, and a gate electrode layer on the first to fourth regions.

According to example embodiments of the inventive concepts, a semiconductor device may include a first fin-type transistor, a second fin-type transistor, a third fin-type transistor, and a fourth fin-type transistor that are on a substrate, the first to fourth fin-type transistors having different respective threshold voltages. The first fin-type transistor may include a first gate insulating layer, a first material layer, and a first gate electrode layer. The second fin-type transistor may include a second gate insulating layer, a second material layer, and a second gate electrode layer. The second material layer may be thinner than the first material layer. The third fin-type transistor may include a third gate insulating layer, a third material layer, and a third gate electrode layer. The third material layer may be thinner than the second material layer. The fourth fin-type transistor may include a fourth gate insulating layer and a fourth gate electrode layer. The first material layer may include a lower metal layer, an upper metal layer, and a polysilicon layer between the lower metal layer and the upper metal layer.

BRIEF DESCRIPTION OF THE DRAWINGS

The above and other objects and features of the inventive concepts will become apparent by describing in detail example embodiments thereof with reference to the accompanying drawings.

DETAILED DESCRIPTION

Figure 1:
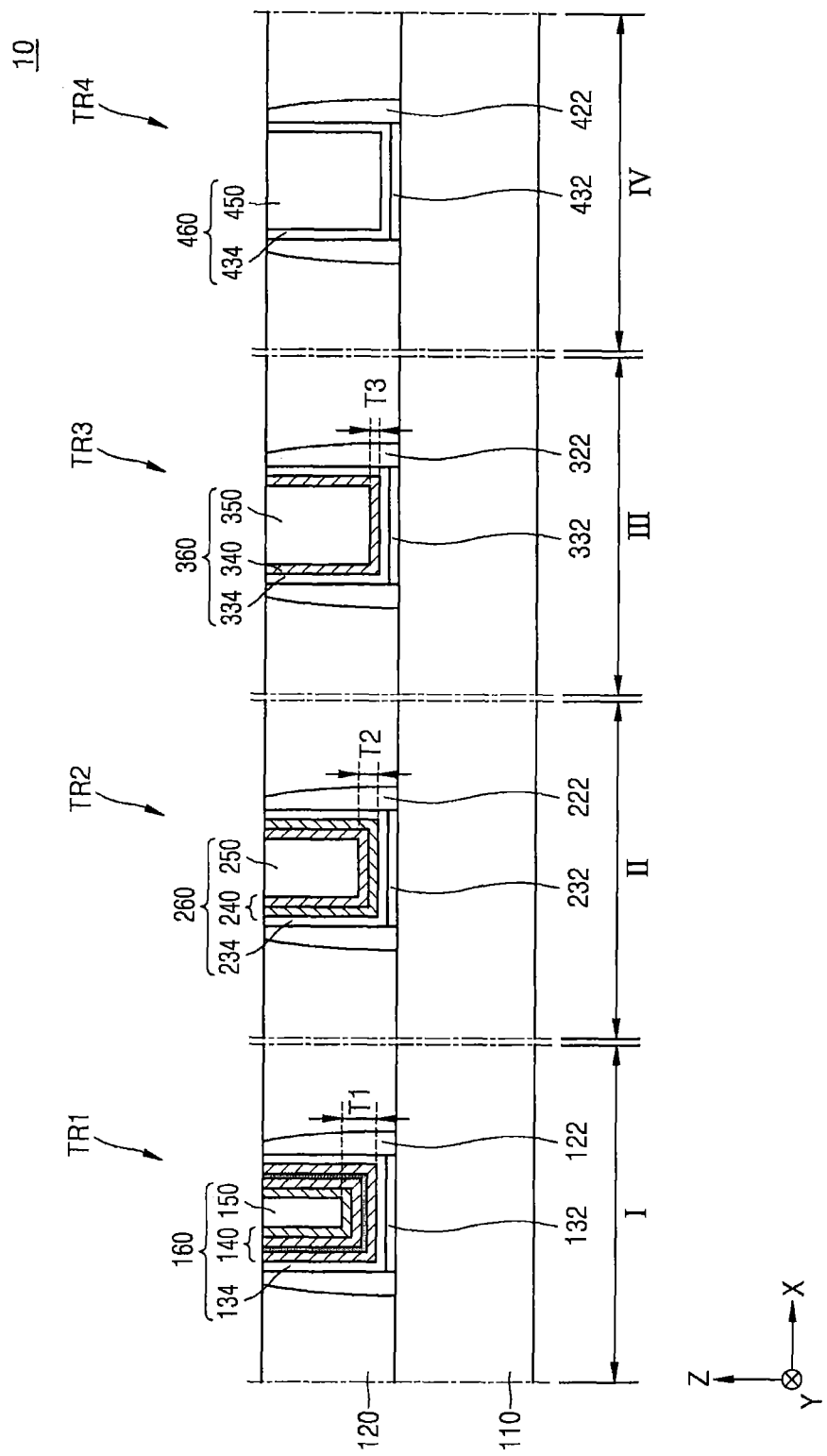
FIG. 1 is a cross-sectional view illustrating a semiconductor device according to example embodiments of the inventive concepts.

Various example embodiments will now be described more fully hereinafter with reference to the accompanying drawings. Like reference numerals refer to like elements throughout this application.

FIG. 1 is a cross-sectional view illustrating a semiconductor device according to example embodiments of the inventive concepts.

Referring to FIG. 1, a semiconductor device 10 may include a first transistor TR1, a second transistor TR2, a third transistor TR3, and a fourth transistor TR4. The first, second, third, and fourth transistors TR1, TR2, TR3, and TR4 may respectively be disposed on first, second, third, and fourth regions I, II, III, and IV of a substrate 110.

The substrate 110 may include silicon, e.g., single-crystalline silicon, polysilicon, or amorphous silicon. In some embodiments, the substrate 110 may include a group IV semiconductor, such as germanium (Ge), a group IV-IV compound semiconductor, such as silicon germanium (SiGe) or silicon carbide (SiC), or a group III-V compound semiconductor, such as gallium arsenide (GaAs), indium arsenide (InAs), indium phosphide (InP).

The substrate 110 may be a silicon bulk substrate or a silicon on insulator (SOI) substrate. In some embodiments, the substrate 110 may be an epitaxial wafer, a polished wafer, or an annealed wafer.

The substrate 110 may include a conductive region, e.g., an impurity-doped well, and/or various impurity-doped structures. The substrate 110 may be a p-type or n-type substrate.

The substrate 110 may be divided into various regions according to the kind of devices formed on the substrate 110. For example, the substrate 110 may be divided into a logic region in which a logic/operation device is formed and a memory region in which a memory device is formed, but the present inventive concepts are not limited thereto. In some embodiments, the substrate 110 may be divided into three or more regions.

The first to fourth transistors TR1, TR2, TR3, and TR4 of the semiconductor device 10 may be separated from one another by an isolation layer formed in the substrate 110. The isolation layer may be, e.g., a shallow trench isolation (STI) layer. In some embodiments, in the case where the substrate 110 includes an active fin structure formed by patterning an epitaxial layer, the isolation layer may be a deep trench isolation layer.

The first transistor TR1 on the first region I may include a first spacer 122, a first interface layer 132, and a first gate structure 160. The first gate structure 160 may include a first gate insulating layer 134, a first material layer 140 having a first thickness T1, and a first gate electrode layer 150. The first gate electrode layer 150 may include a plurality of conductive layers, e.g., a first TiAlC layer, a first barrier layer, and/or a first gate metal layer.

The second transistor TR2 on the second region II may include a second spacer 222, a second interface layer 232, and a second gate structure 260. The second gate structure 260 may include a second gate insulating layer 234, a second material layer 240 having a second thickness T2, and a second gate electrode layer 250. The second gate electrode layer 250 may include a plurality of conductive layers, e.g., a second TiAlC layer, a second barrier layer, and/or a second gate metal layer.

The third transistor TR3 on the third region III may include a third spacer 322, a third interface layer 332, and a third gate structure 360. The third gate structure 360 may include a third gate insulating layer 334, a third material layer 340 having a third thickness T3, and a third gate electrode layer 350. The third gate electrode layer 350 may include a plurality of conductive layers, e.g., a third TiAlC layer, a third barrier layer, and/or a third gate metal layer.

The fourth transistor TR4 on the fourth region IV may include a fourth spacer 422, a fourth interface layer 432, and a fourth gate structure 460. The fourth gate structure 460 may include a fourth gate insulating layer 434 and a fourth gate electrode layer 450. The fourth gate electrode layer 450 may include a plurality of conductive layers, e.g., a fourth TiAlC layer, a fourth barrier layer, and/or a fourth gate metal layer. The fourth transistor TR4 may not include a fourth material layer, unlike the first to third transistors TR1, TR2, and TR3.

According to some embodiments, first to fourth source/drain regions may be formed in the substrate 110 by injecting a predetermined impurity into the substrate 110. For example, when each of the first to fourth transistors is an NMOS transistor, an n-type impurity may be injected into the first to fourth source/drain regions. When each of the first to fourth transistors is a PMOS transistor, a p-type impurity may be injected into the first to fourth source/drain regions.

In some embodiments, the first to fourth source/drain regions may be elevated source/drain regions. In this case, each of the first to fourth source/drain regions may include an epitaxial layer formed on the substrate 110.

An interlayer insulating layer 120 may be disposed on the substrate 110. The interlayer insulating layer 120 may include a plurality of trenches 130, 230, 330, and 430 (see FIG. 3) formed on respective ones of the first to fourth regions I, II, III, and IV. The first to fourth spacers 122, 222, 322, and 422 may be disposed at opposite sides of respective ones of the plurality of trenches 130, 230, 330, and 430. The first to fourth spacers 122, 222, 322, and 422 may include, e.g., silicon oxide, silicon nitride, and/or silicon oxynitride. In some embodiments, the first to fourth spacers 122, 222, 322, and 422 may have an L- or I-shaped cross-section, unlike the shape as shown in the figures.

Figure 3:
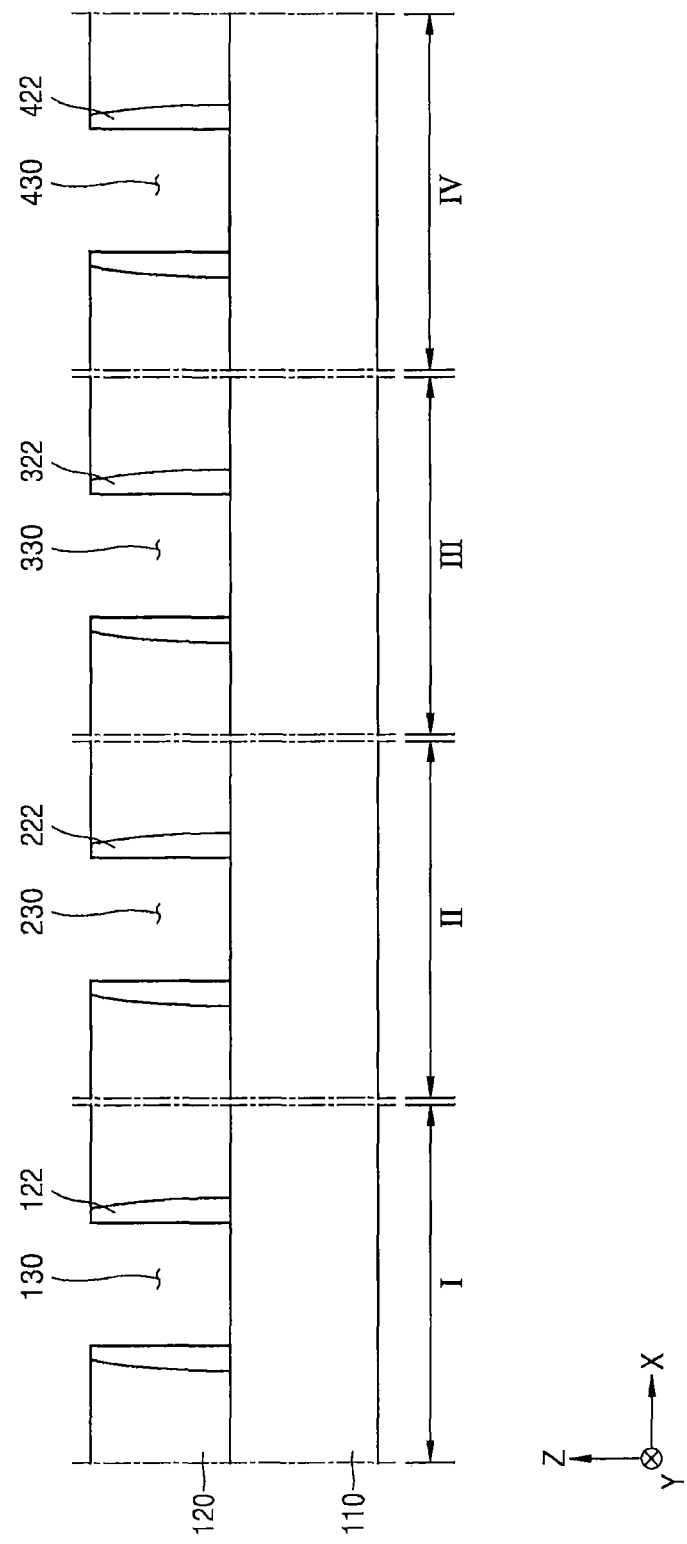

The first to fourth interface layers 132, 232, 332, and 432 and the first to fourth gate structures 160, 260, 360, and 460 may respectively be sequentially formed in the plurality of trenches 130, 230, 330, and 430 (see FIG. 3).

The first to fourth interface layers 132, 232, 332, and 432 may serve to reduce and/or prevent interface problems between the substrate 110 and the first to fourth gate insulating layers 134, 234, 334, and 434. The first to fourth interface layers 132, 232, 332, and 432 may include, e.g., silicon oxide, silicon oxynitride, and/or metal silicate.

The first to fourth gate insulating layers 134, 234, 334, and 434 may include a high-k dielectric material having a higher dielectric constant than that of silicon oxide, e.g., hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium, oxide (TiO), barium strontium titanium oxide (BaSrTiO), barium titanium oxide (BaTiO), strontium titanium oxide (SrTiO), yttrium oxide (YO), aluminum oxide (AlO), and/or lead scandium tantalum oxide (PbScTaO).

The first to fourth gate insulating layers 134, 234, 334, and 434 may respectively extend along upper surfaces of the first to fourth interface layers 132, 232, 332, and 432 in a first direction X and along sidewalls of the first to fourth spacers 122, 222, 322, and 422 in a third direction Z. The first direction X may be parallel to an upper surface of the substrate 110. The third direction Z may be perpendicular to the upper surface of the substrate 110. The first to fourth gate insulating layers 134, 234, 334, and 434 may be formed by a replacement metal gate process. In some embodiments, the first to fourth gate insulating layers 134, 234, 334, and 434 may respectively not extend along the sidewalls of the first to fourth spacers 122, 222, 322, and 422 in the third direction Z when a gate first process is used.

In respective ones of the first to third regions I, II, and III of the substrate 110, the first to third material layers 140, 240, and 340 may respectively be disposed on the first to third gate insulating layers 134, 234, and 334. According to some embodiments, the first, second, and third material layers 140, 240, and 340 may respectively have the first, second, and third thicknesses T1, T2, and T3. The first to third thicknesses T1, T2, and T3 may be different from one another. The first thickness T1 may be greater than the second thickness T2. The second thickness T2 may be greater than the third thickness T3.

The first to third material layers 140, 240, and 340 may include a titanium nitride (TiN) layer having respectively different thicknesses as a work function adjusting material layer. Additionally, a fourth material layer may not be formed on the fourth region IV of the substrate 110. Accordingly, the first to fourth transistors TR1, TR2, TR3, and TR4 may respectively have threshold voltages Vt1, Vt2, Vt3, and Vt4 that are different from one another.

In some embodiments, the first and second transistors TR1 and TR2 may be PMOS transistors, and the third and fourth transistors TR3 and TR4 may be NMOS transistors. In this case, the first and second transistors TR1 and TR2 may respectively have the first and second material layers 140 and 240 that are relatively thick, in comparison with the third and fourth transistors TR3 and TR4. The first and second material layers 140 and 240 may have a greater thickness than the third material layer 340. This is because the titanium nitride (TiN) layer included in the first to third material layers 140, 240, and 340 may be a p-type work function adjusting material layer.

The first and fourth regions I and IV may be relatively low voltage regions, and the second and third regions II and III may be relatively high voltage regions. The first transistor TR1 on the first region I may be a low voltage PMOS transistor. The second transistor TR2 on the second region II may be a high voltage PMOS transistor. The third transistor TR3 on the third region III may be a high voltage NMOS transistor. The fourth transistor TR4 on the fourth region IV may be a low voltage NMOS transistor.

The threshold voltage Vt1 of the first transistor TR1 on the first region I may be lower than the threshold voltage Vt2 of the second transistor TR2 on the second region II. The threshold voltage Vt3 of the third transistor TR3 on the third region III may be higher than the threshold voltage Vt4 of the fourth transistor TR4 on the fourth region IV.

In some embodiments, all of the first to fourth regions I, II, III, and IV may be PMOS regions or all of the first to fourth regions I, II, III, and IV may be NMOS regions. In some embodiments, three or more of the first to fourth regions I, II, III, and IV may be PMOS regions or three or more of the first to fourth regions I, II, III, and IV may be NMOS regions. The threshold voltage of the transistor on each region may be adjusted by a thickness of the work function adjusting material layer, e.g., the thickness of the titanium nitride (TiN) layer.

The first to third gate electrode layers 150, 250, and 350 may respectively be disposed on the first to third material layers 140, 240, and 340, and the fourth gate electrode layer 450 may be disposed on the fourth gate insulating layer 434. The first to fourth gate electrode layers 150, 250, 350, and 450 may include the plurality of conductive layers as described above (e.g., a TiAlC layer, a barrier layer, and/or a gate metal layer). The first to fourth barrier layers may include, e.g., a titanium nitride (TiN) layer and may reduce and/or prevent a material included in the first to fourth gate metal layers from diffusing into the first to fourth TiAlC layers. The first to fourth gate metal layers may include, e.g., aluminum and/or tungsten and may be within and/or fill portions of the plurality of trenches 130, 230, 330, and 430 (see FIG. 3) on the first to fourth regions I, II, III, and IV.

The first to fourth gate structures 160, 260, 360, and 460 may not include a tantalum nitride (TaN) layer as the work function adjusting material layer. The threshold voltages of the first to fourth transistors TR1, TR2, TR3, and TR4 may be adjusted by the different thicknesses of the first to third material layers 140, 240, and 340 and by not forming the fourth material layer.

Figure 10:
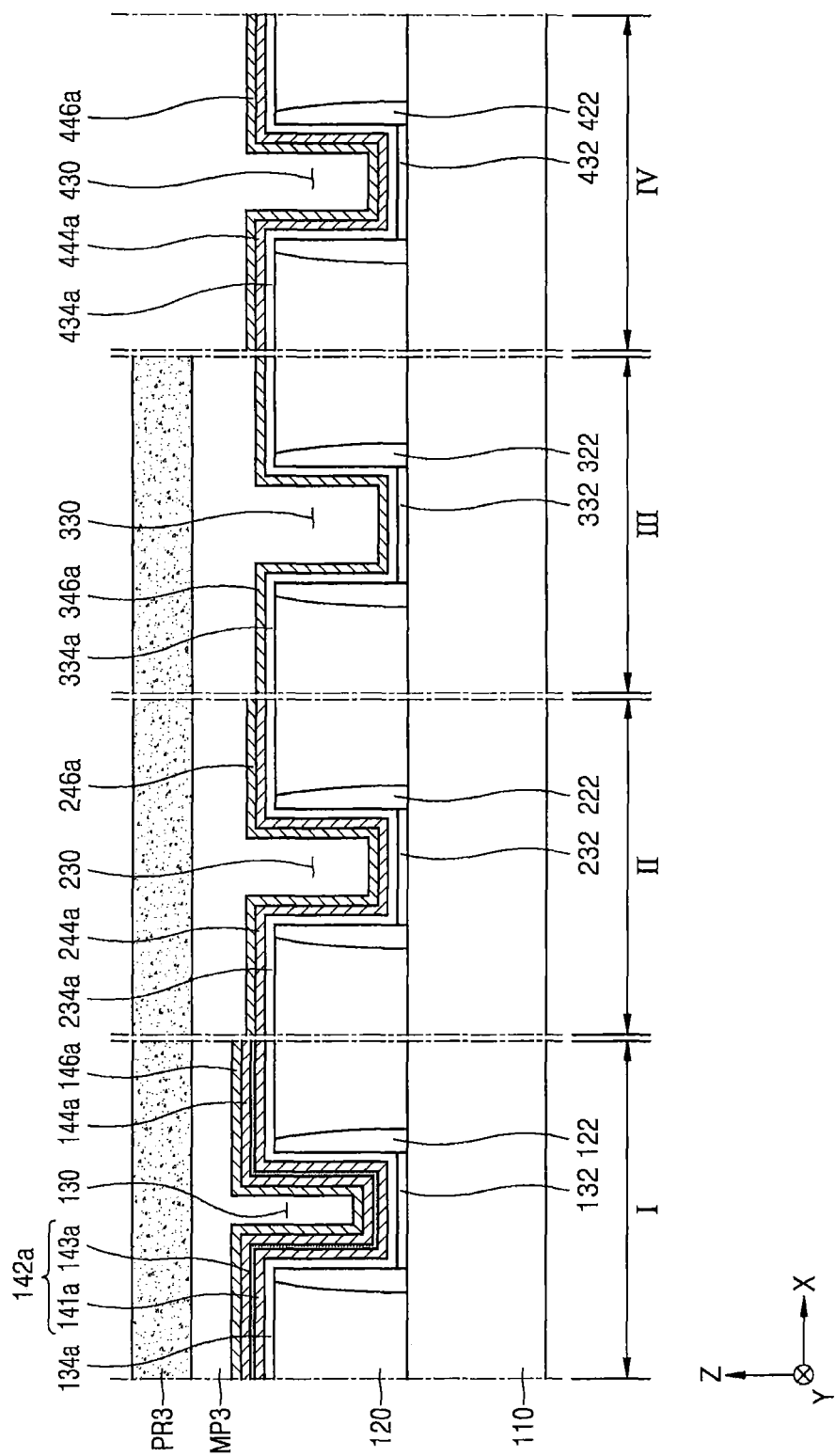
Figure 11:
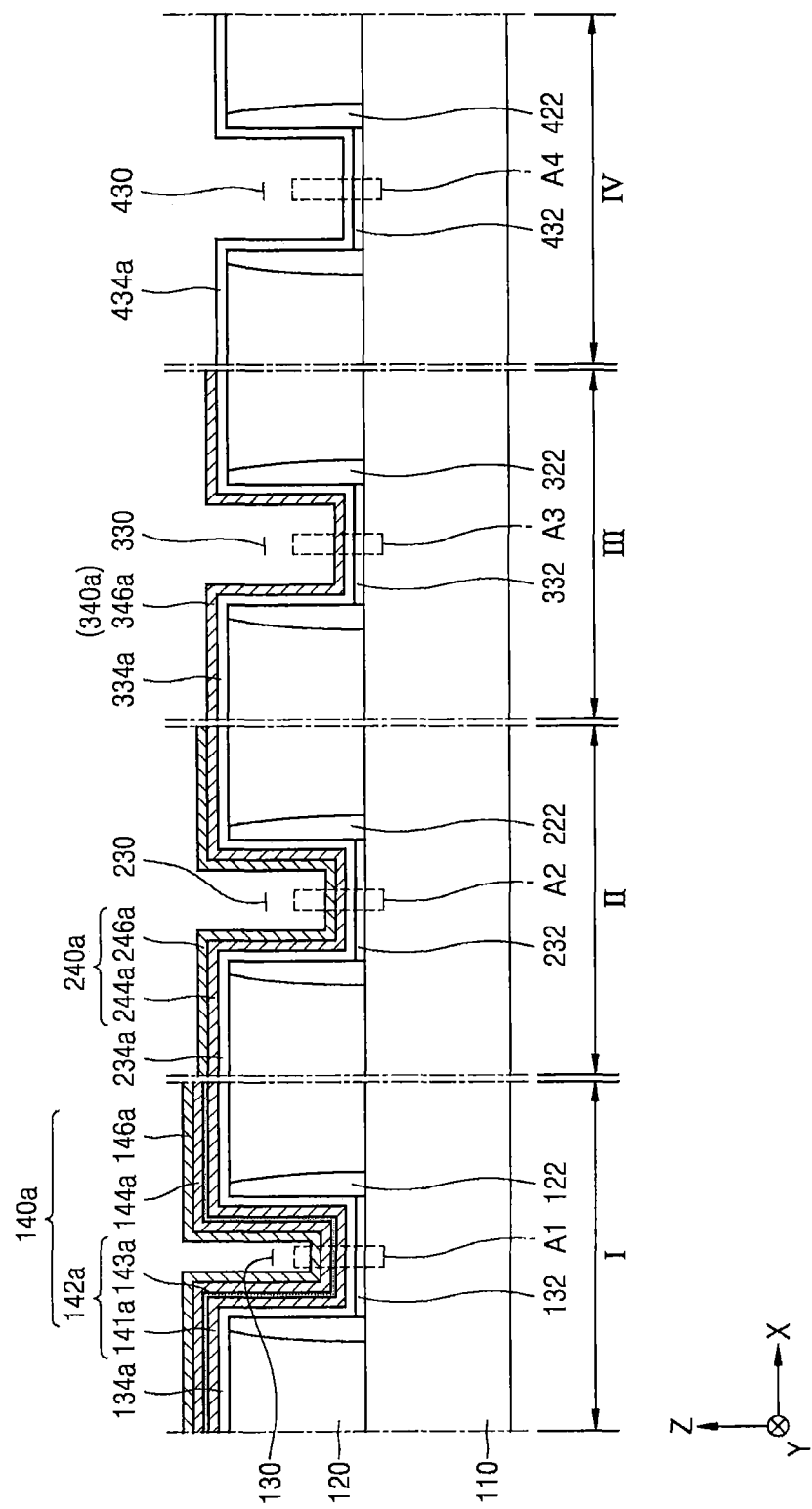
Figure 12:
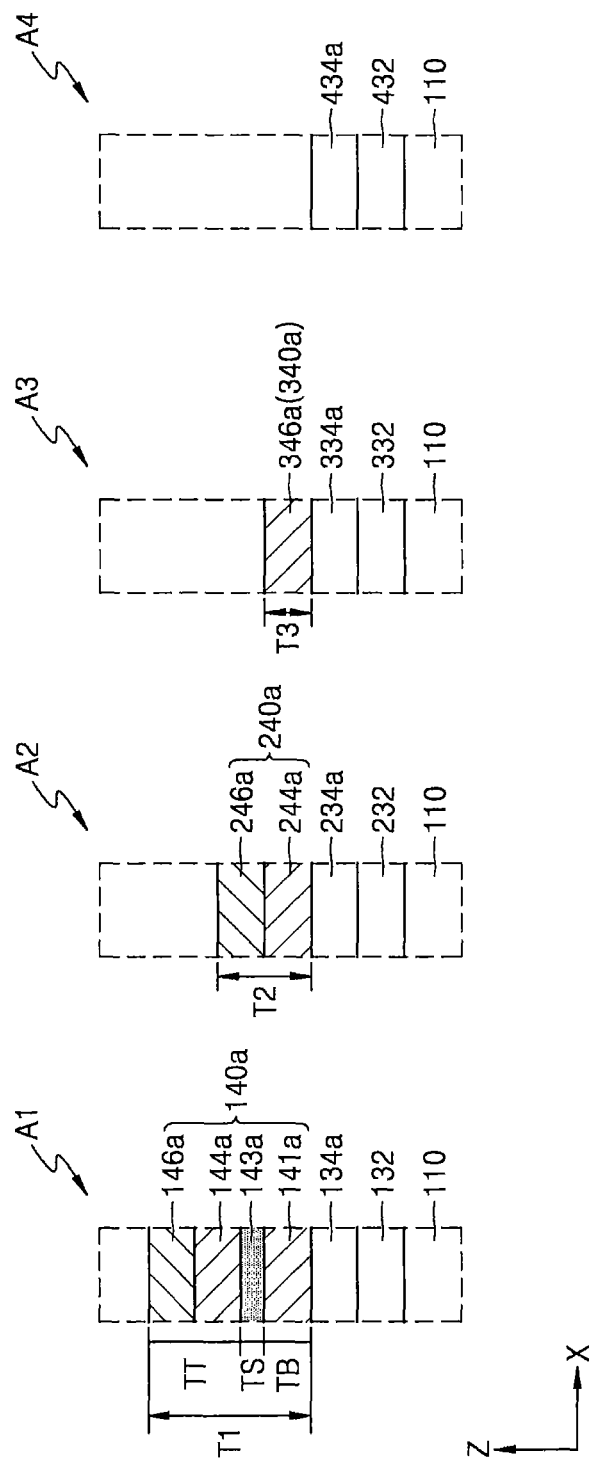

FIGS. 2 to 13 are cross-sectional views illustrating a method of manufacturing a semiconductor device according to example embodiments of the inventive concepts. FIG. 12 illustrates enlarged views of portions A1, A2, A3, and A4 of FIG. 11.

Figure 2:
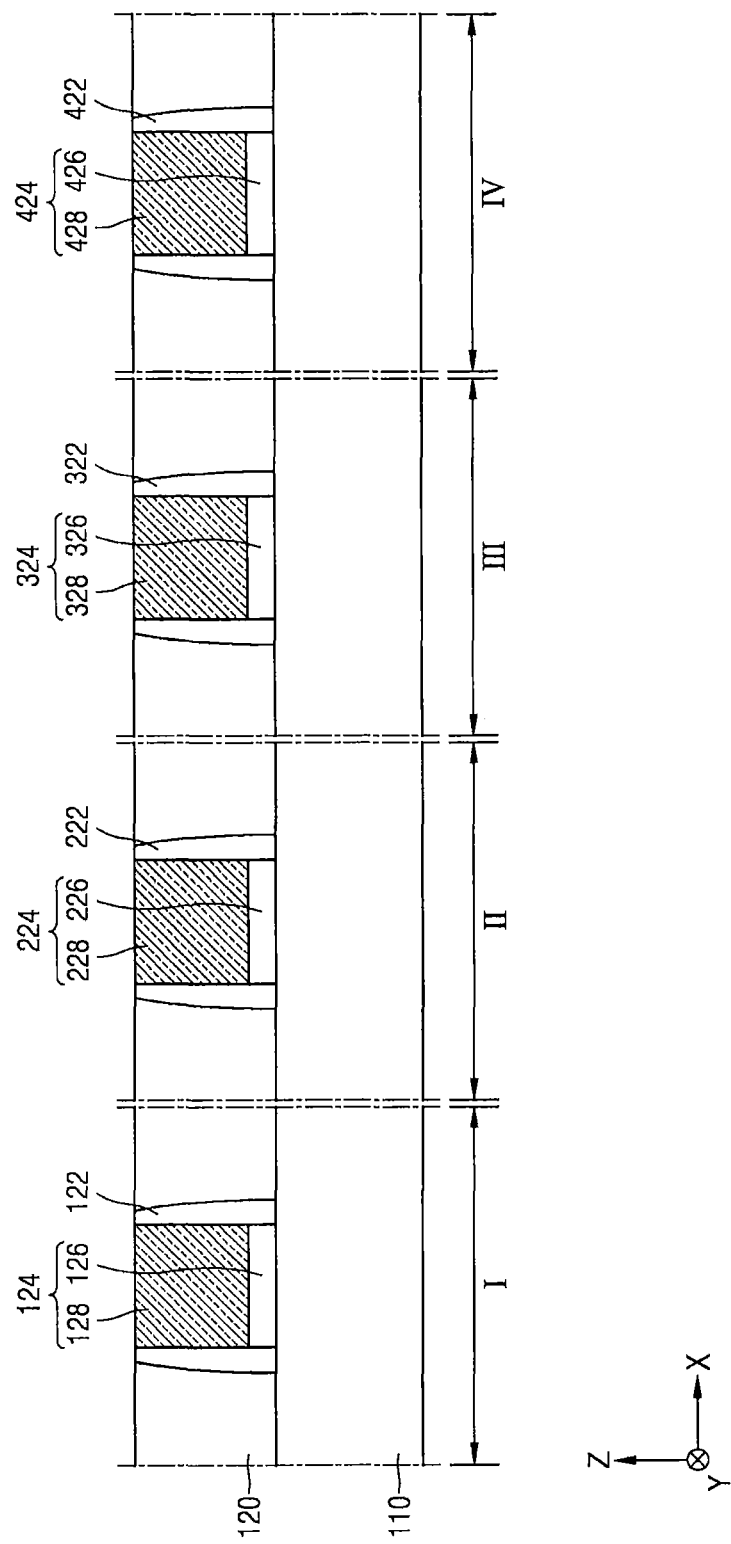
FIGS. 2 to 13 are cross-sectional views illustrating a method of manufacturing a semiconductor device according to example embodiments of the inventive concepts.

Referring to FIG. 2, a first dummy gate structure 124 may be formed on the first region I of the substrate 110. A second dummy gate structure 224 may be formed on the second region II of the substrate 110. A third dummy gate structure 324 may be formed on the third region III of the substrate 110. A fourth dummy gate structure 424 may be formed on the fourth region IV of the substrate 110.

The first to fourth regions I, II, III, and IV may be connected to or spaced from one another.

The first dummy gate structure 124 may include a first dummy gate insulating layer 126 and a first dummy gate electrode layer 128. The second dummy gate structure 224 may include a second dummy gate insulating layer 226 and a second dummy gate electrode layer 228. The third dummy gate structure 324 may include a third dummy gate insulating layer 326 and a third dummy gate electrode layer 328. The fourth dummy gate structure 424 may include a fourth dummy gate insulating layer 426 and the fourth dummy gate electrode layer 428.

The first to fourth dummy gate insulating layers 126, 226, 326, and 426 may respectively be formed on the substrate 110 and may include, e.g., silicon oxide. The first to fourth dummy gate electrode layers 128, 228, 328, and 428 may respectively be formed on the first to fourth dummy gate insulating layers 126, 226, 326, and 426 and may include, e.g., polysilicon.

In some embodiments, impurities may be injected into the substrate 110 using the first to fourth dummy gate structures 124, 224, 324, and 424 as an ion injection mask to form the first to fourth source/drain regions. The first to fourth spacers 122, 222, 322, and 422 may respectively be formed on sidewalls of the first to fourth dummy gate structures 124, 224, 324, and 424. The first to fourth spacers 122, 222, 322, and 422 may include, e.g., silicon oxide, silicon nitride, and/or silicon oxynitride. The first to fourth spacers 122, 222, 322, and 422 may be formed by forming a spacer layer to cover the first to fourth dummy gate structures 124, 224, 324, and 424 and etching-back the spacer layer.

The interlayer insulating layer 120 may be formed on the substrate 110. The interlayer insulating layer 120 may cover sidewalls of the first to fourth spacers 122, 222, 322, and 422 and may expose upper surfaces of the first to fourth dummy gate structures 124, 224, 324, and 424. To expose the upper surfaces of the first to fourth dummy gate structures 124, 224, 324, and 424, the interlayer insulating layer 120 may be formed by performing a planarization process after forming a preliminary insulating layer. In some embodiments, the interlayer insulating layer 120 may be formed of two or more stacked insulating layers.

Referring to FIG. 3, the first to fourth dummy gate structures 124, 224, 324, and 424 may be removed to form the plurality of trenches, e.g., first to fourth trenches, 130, 230, 330, and 430 in the interlayer insulating layer 120.

The first to fourth trenches 130, 230, 330, and 430 may expose inner sidewalls of the first to fourth spacers 122, 222, 322, and 422, respectively, and the upper surface of the substrate 110.

When the first to fourth dummy gate electrode layers 128, 228, 328, and 428 (see FIG. 2) are formed of polysilicon, the first to fourth dummy gate electrode layers 128, 228, 328, and 428 (see FIG. 2) may be removed by, e.g., a wet etching process, but the inventive concepts are not limited thereto. The first to fourth dummy gate insulating layers 126, 226, 326, and 426 (see FIG. 2) exposed after removing the first to fourth dummy gate electrode layers 128, 228, 328, and 428 may be removed by an etching process, e.g., a wet etching process, a dry etching process, or a combination thereof.

Figure 4:
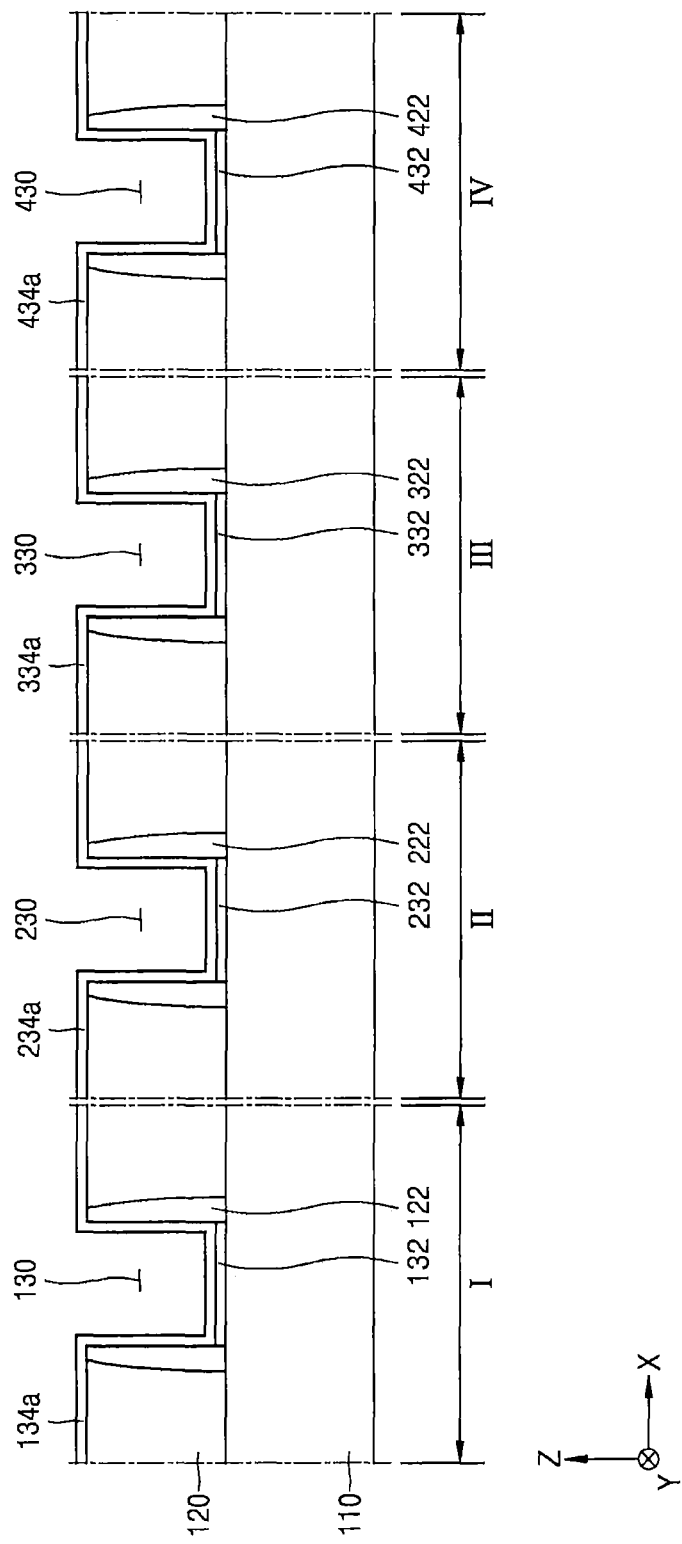

Referring to FIG. 4, the first to fourth interface layers 132, 232, 332, and 432 and first to fourth preliminary gate insulating layers 134a, 234a, 334a, and 434a may be formed on the upper surface of the substrate 110 exposed by the first to fourth trenches 130, 230, 330, and 430, respectively.

The first to fourth interface layers 132, 232, 332, and 432 may be formed by oxidizing the upper surface of the substrate 110 exposed by the first to fourth trenches 130, 230, 330, and 430, respectively, but the inventive concepts are not limited thereto. The first to fourth interface layers 132, 232, 332, and 432 may be formed along bottom surfaces of the first to fourth trenches 130, 230, 330, and 430, respectively.

The first to fourth preliminary gate insulating layers 134a, 234a, 334a, and 434a may be formed in the first to fourth trenches 130, 230, 330, and 430, respectively. For example, the first to fourth preliminary gate insulating layers 134a, 234a, 334a, and 434a may be formed along sidewalls of the first to fourth trenches 130, 230, 330, and 430, respectively, and along upper surfaces of the first to fourth interface layers 132, 232, 332, and 432, respectively.

The first to fourth preliminary gate insulating layers 134a, 234a, 334a, and 434a may be formed on the interlayer insulating layer 120. The first to fourth preliminary gate insulating layers 134a, 234a, 334a, and 434a may include a high-k dielectric material having a higher dielectric constant than that of silicon oxide. The first to fourth preliminary gate insulating layers 134a, 234a, 334a, and 434a may be formed with a predetermined thickness based on the type of transistors which are to be formed.

Figure 5:
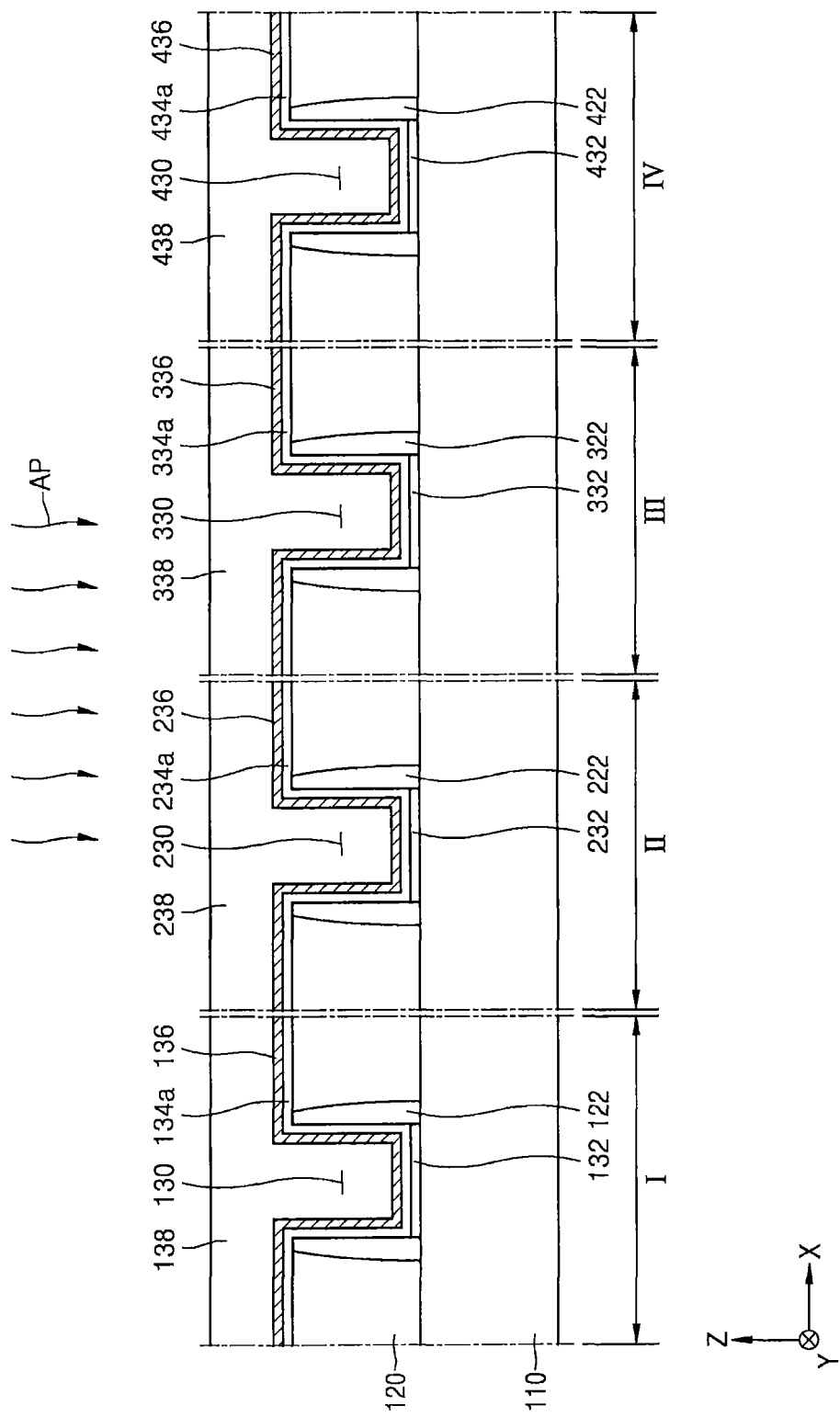

Referring to FIG. 5, first to fourth diffusion layers 136, 236, 336, and 436 and first to fourth capping layers 138, 238, 338, and 438 may be sequentially formed.

The first to fourth diffusion layers 136, 236, 336, and 436 may be conformally formed along surfaces of the first to fourth preliminary gate insulating layers 134a, 234a, 334a, and 434a, respectively. The first to fourth diffusion layers 136, 236, 336, and 436 may include titanium nitride (TiN), but are not limited thereto.

The first to fourth capping layers 138, 238, 338, and 438 may be formed on the first to fourth diffusion layers 136, 236, 336, and 436, respectively. The first to fourth capping layers 138, 238, 338, and 438 may respectively fill the first to fourth trenches 130, 230, 330, and 430 and cover the first to fourth diffusion layers 136, 236, 336, and 436 so as to restrict exposure of the first to fourth diffusion layers 136, 236, 336, and 436 to the outside environment. The first to fourth capping layers 138, 238, 338, and 438 may include, e.g., amorphous silicon.

Next, an annealing process AP may be performed. The first to fourth preliminary gate insulating layers 134a, 234a, 334a, and 434a may include oxygen atoms. The oxygen atom may be bonded with another atom, e.g., a hafnium atom, a zirconium atom, a tantalum atom, or a titanium atom. However, some of bonds thereof may be broken. When the bond of the oxygen atom is broken, a leakage current may be generated. Thus, performance of the transistor may be lowered. The annealing process AP may be performed to re-combine the broken portion of the oxygen atom bond with an oxygen atom. When the annealing process AP is performed, the oxygen atoms in the first to fourth diffusion layers 136, 236, 336, and 436 may be provided to the first to fourth preliminary gate insulating layers 134a, 234a, 334a, and 434a, respectively.

If the first to fourth diffusion layers 136, 236, 336, and 436 are exposed to the outside environment during the annealing process AP, the exterior oxygen atoms may penetrate into the first to fourth diffusion layers 136, 236, 336, and 436, thereby increasing the number of the oxygen atoms moving to the first to fourth preliminary gate insulating layers 134a, 234a, 334a, and 434a. When the oxygen atoms more than the desired number of the oxygen atoms are supplied into the first to fourth preliminary gate insulating layers 134a, 234a, 334a, and 434a, the over-supplied oxygen atoms may react with the substrate 110 exposed by the first to fourth trenches 130, 230, 330, and 430. Accordingly, a thickness of each of the first to fourth interface layers 132, 232, 332, and 432 may be increased, thus lowering the performance of the transistor. According to example embodiments of the inventive concepts, since the first to fourth capping layers 138, 238, 338, and 438 are formed on the first to fourth diffusion layers 136, 236, 336, and 436, the first to fourth diffusion layers 136, 236, 336, and 436 may be blocked from the outside environment during the annealing process AP, thus properly controlling the supply of the oxygen atoms.

The annealing process may be performed at a temperature of about 500° C. to about 1500° C. The thickness of each of the first to fourth diffusion layers 136, 236, 336, and 436 may be properly controlled depending on the number of the oxygen atoms to be supplied.

The amorphous silicon forming the first to fourth capping layers 138, 238, 338, and 438 may be transformed into polysilicon by the annealing process AP. In a region where the first to fourth capping layers 138, 238, 338, and 438 contact the first to fourth diffusion layers 136, 236, 336, and 436, polysilicon forming the first to fourth capping layers 138, 238, 338, and 438 may be chemically combined with titanium nitride (TiN) forming the first to fourth diffusion layers 136, 236, 336, and 436. This combination may result in the formation of eleventh to fourteenth preliminary material layers 142a, 242a, 342a, and 442a (see FIG. 6).

Figure 6:
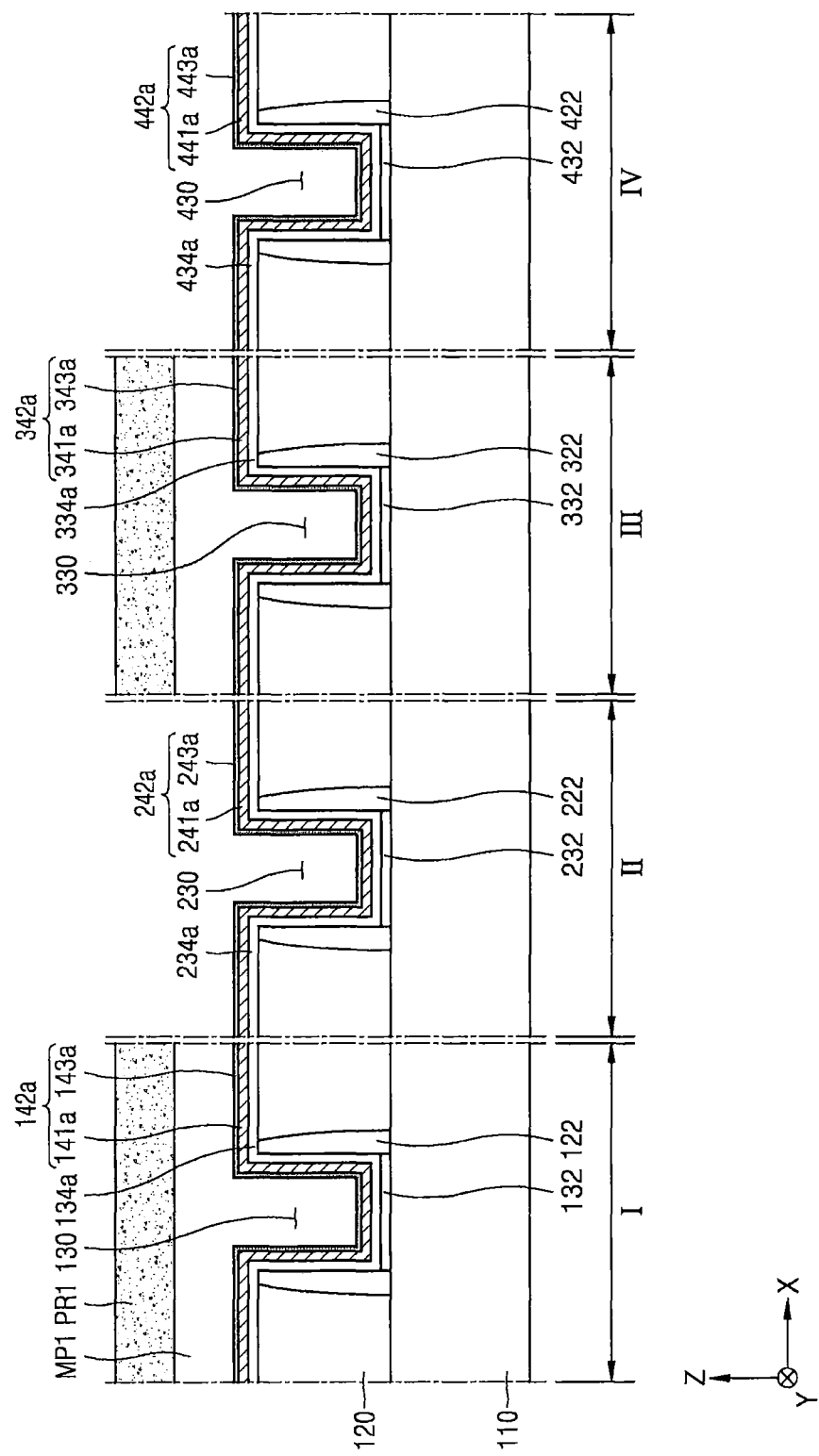

Referring to FIGS. 5 and 6, the eleventh to fourteenth preliminary material layers 142a, 242a, 342a, and 442a may include eleventh to fourteenth preliminary lower layers 141a, 241a, 341a, and 441a, respectively, and the eleventh to fourteenth preliminary upper layers 143a, 243a, 343a, and 443a, respectively. The eleventh to fourteenth preliminary upper layers 143a, 243a, 343a, and 443a may be formed of polysilicon, which has an improved bonding strength.

The eleventh to fourteenth preliminary lower layers 141a, 241a, 341a, and 441a may be formed by the annealing process AP. For example, the eleventh to fourteenth preliminary lower layers 141a, 241a, 341a, and 441a may respectively correspond to respective portions of the first to fourth diffusion layers 136, 236, 336, and 436 left unreacted with polysilicon.

As above described, the eleventh to fourteenth preliminary upper layers 143a, 243a, 343a, and 443a may respectively be formed by the chemical bonding between the respective ones of the first to fourth capping layers 138, 238, 338, and 438 and the respective ones of the first to fourth diffusion layers 136, 236, 336, and 436 through the annealing process AP. Thus, the eleventh to fourteenth preliminary upper layers 143a, 243a, 343a, and 443a may be chemically bonded with the eleventh to fourteenth preliminary lower layers 141a, 241a, 341a, and 441a.

According to some embodiments, the eleventh to fourteenth preliminary material layers 142a, 242a, 342a, and 442a may be constituted by respective portions of the first to fourth capping layers 138, 238, 338, and 438, used to improve film qualities of the first to fourth preliminary gate insulating layers 134a, 234a, 334a, and 434a, and the respective ones of the first to fourth diffusion layers 136, 236, 336, and 436. In other words, even without an additional process, the material used to perform another function may be used as the work function adjusting material. Thus, manufacturing efficiency and productivity of the semiconductor device may be improved.

After forming the eleventh to fourteenth preliminary upper layers 143a, 243a, 343a, and 443a, the first to fourth capping layers 138, 238, 338, and 438 may be removed by an etching process. At this time, the etching process may be controlled not to remove the eleventh to fourteenth preliminary upper layers 143a, 243a, 343a, and 443a.

Referring to FIG. 6, a first mask pattern MP1 and a first photoresist pattern PR1 are formed to cover the eleventh and thirteenth preliminary material layers 142a and 342a and expose the twelfth and fourteenth preliminary material layers 242a and 442a.

To form the first mask pattern MP1, a mask layer may be formed on the eleventh to fourteenth preliminary material layers 142a, 242a, 342a, and 442a to fill the first to fourth trenches 130, 230, 330, and 430. The mask layer may also be formed on the interlayer insulating layer 120. The mask layer may include a material having an improved gap-fill property.

The first photoresist pattern PR1 may be formed on the mask layer. The first photoresist pattern PR1 may expose a portion of the mask layer on the twelfth and fourteenth preliminary material layers 242a and 442a and cover another portion of the mask layer on the eleventh and thirteenth preliminary material layers 142a and 342a. The first photoresist pattern PR1 may cover the first and third regions I and III and expose the second and fourth regions II and IV.

The portion of the mask layer exposed on the second and fourth regions II and IV may be etched using the first photoresist pattern PR1 as an etch mask, thus forming the first mask pattern MP1 on the eleventh and thirteenth preliminary material layers 142a and 342a. The exposed mask layer may be etched by a dry etching process, e.g., a reactive ion etching process.

Figure 7:
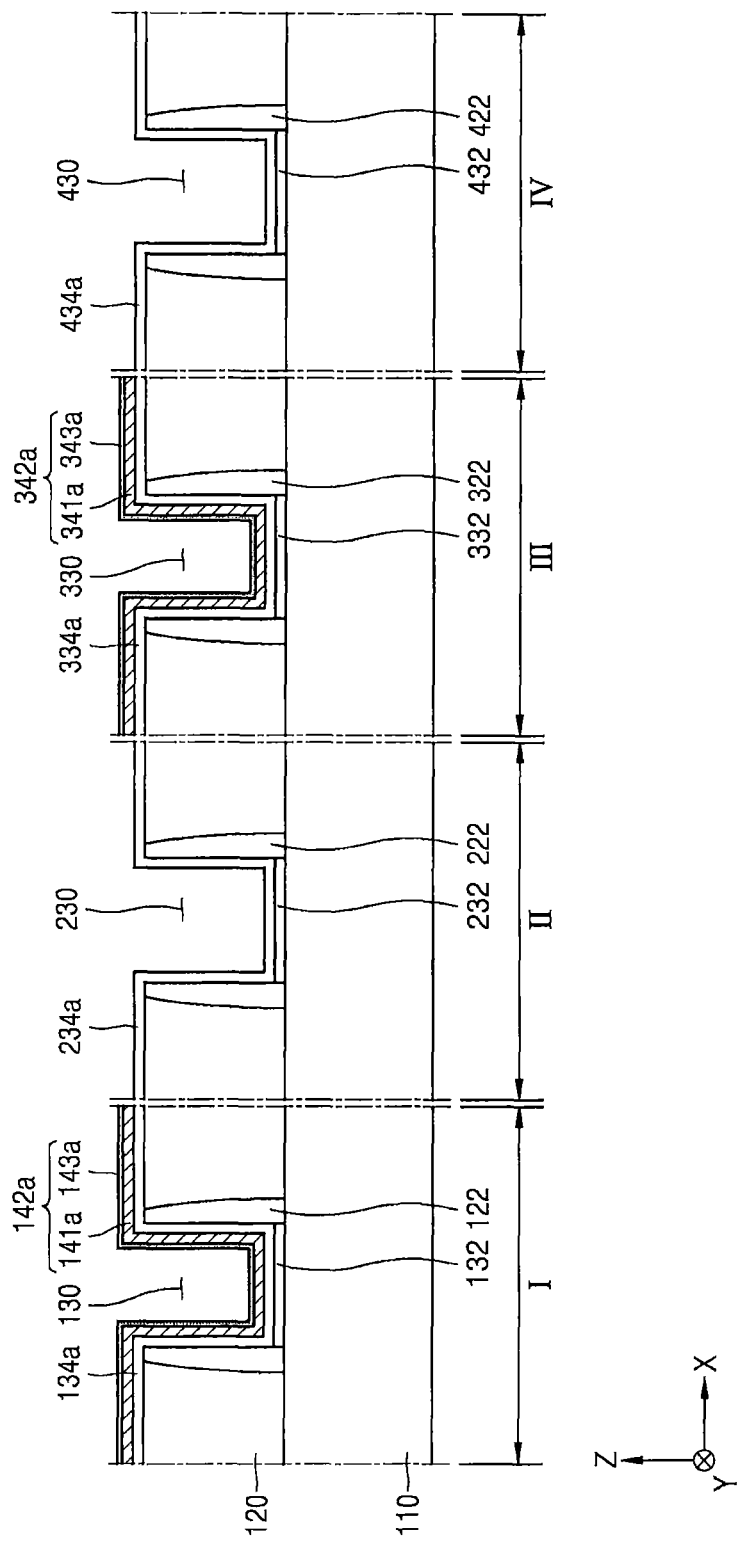

Referring to FIG. 7, the twelfth and fourteenth preliminary material layers 242a and 442a (see FIG. 6) may be removed using the first mask pattern MP1 (see FIG. 6) and the first photoresist pattern PR1 (see FIG. 6) as an etch mask. Thus, the second and fourth preliminary gate insulating layers 234a and 434a may be exposed. The first mask pattern MP1 (see FIG. 6) and the first photoresist pattern PR1 (see FIG. 6) may be removed.

Specifically, the twelfth and fourteenth preliminary material layers 242a and 442a (see FIG. 6) formed on the surfaces of the second and fourth preliminary gate insulating layers 234a and 434a may be removed using the first mask pattern MP1 (see FIG. 6) and the first photoresist pattern PR1 (see FIG. 6) as the etch mask.

The twelfth and fourteenth preliminary material layers 242a and 442a (see FIG. 6) may be removed by, e.g., a wet etching process. The wet etching process may be used to minimize etch damage to the second and fourth preliminary gate insulating layers 234a and 434a during the removal of the twelfth and fourteenth preliminary material layers 242a and 442a (see FIG. 6).

Next, the first mask pattern MP1 (see FIG. 6) and the first photoresist pattern PR1 (see FIG. 6) on the eleventh and thirteenth preliminary material layers 142a and 342a may be removed by an ashing and strip process, thus exposing the eleventh and thirteenth preliminary material layers 142a and 342a.

Figure 8:
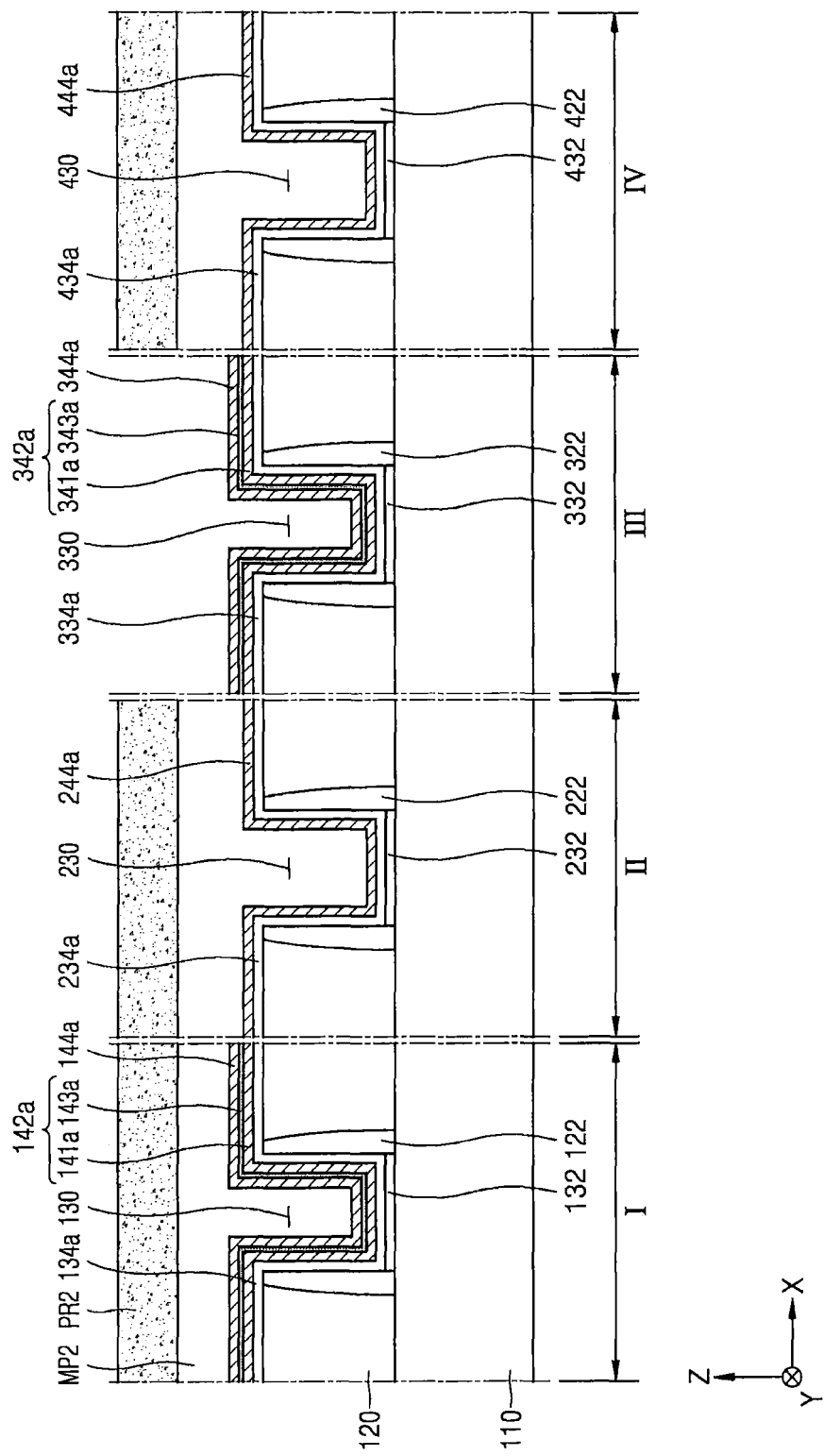

Referring to FIG. 8, twenty-first to twenty-fourth preliminary material layers 144a, 244a, 344a, and 444a respectively may be formed on the eleventh and thirteenth preliminary material layers 142a and 342a and the second and fourth preliminary gate insulating layers 234a and 434a.

The twenty-first to twenty-fourth preliminary material layers 144a, 244a, 344a, and 444a may respectively be conformally formed along surfaces of the eleventh and thirteenth preliminary material layers 142a and 342a and surfaces of the second and fourth preliminary gate insulating layers 234a and 434a. The twenty-first to twenty-fourth preliminary material layers 144a, 244a, 344a, and 444a may include, e.g., titanium nitride (TiN), but the inventive concepts are not limited thereto.

A second mask pattern MP2 and a second photoresist pattern PR2 may be formed on the first, second, and fourth regions I, II, and IV. The second mask pattern MP2 and the second photoresist pattern PR2 may cover the twenty-first, twenty-second, and twenty-fourth preliminary material layers 144a, 244a, and 444a and expose the twenty-third preliminary material layer 344a. The second mask pattern MP2 and the second photoresist pattern PR2 may respectively be substantially the same as the first mask pattern MP1 (see FIG. 6) and the first photoresist pattern PR1 (see FIG. 6) that are described above, except for a difference in the regions that are covered and exposed.

Figure 9:
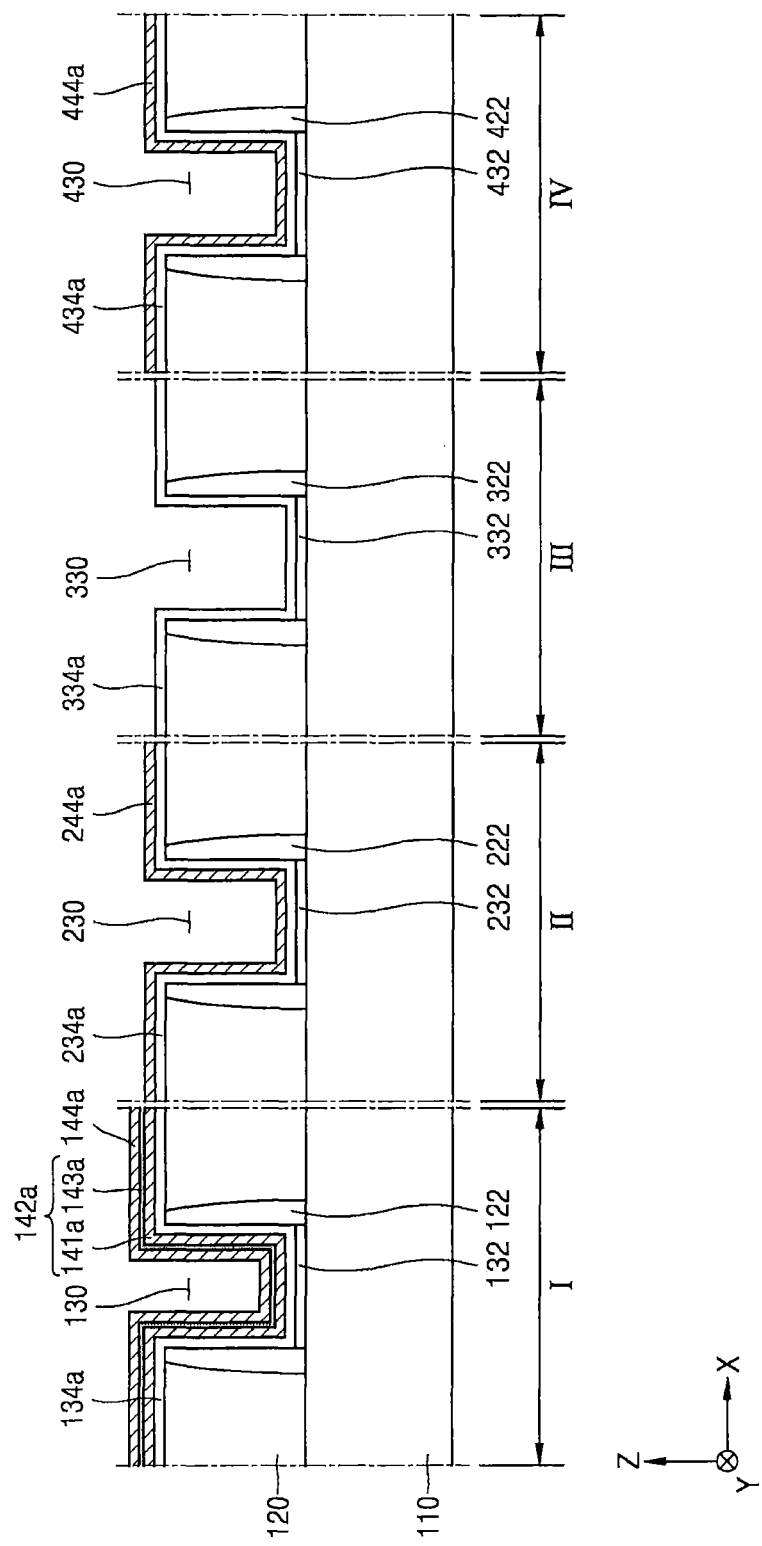

Referring to FIG. 9, the thirteenth and twenty-third preliminary material layers 342a and 344a (see FIG. 8) may be removed using the second mask pattern MP2 (see FIG. 8) and the second photoresist pattern PR2 (see FIG. 8) as an etch mask, thus exposing the third preliminary gate insulating layer 334a. The second mask pattern MP2 (see FIG. 8) and the second photoresist pattern PR2 (see FIG. 8) may be removed.

The removing of the thirteenth and twenty-third preliminary material layers 342a and 344a (see FIG. 8) using the second mask pattern MP2 (see FIG. 8) and the second photoresist pattern PR2 (see FIG. 8) may be substantially the same as the removing of the twelfth and fourteenth preliminary material layers 242a and 442a (see FIG. 6) using the first mask pattern MP1 (see FIG. 6) and the first photoresist pattern PR1 (see FIG. 6) that are described above, except for difference in the removing region.

By the etching process described with reference to FIGS. 7 to 9, the twelfth to fourteenth preliminary material layers 242a, 342a, and 442a may be removed, and the eleventh preliminary material layer 142a on the first region I may remain. The eleventh preliminary material layer 142a including the eleventh preliminary upper layer 143a formed of polysilicon may remain in only the first region I.

Referring to FIG. 10, thirty-first to thirty-fourth preliminary material layers 146a, 246a, 346a, and 446a respectively may be formed on the twenty-first, twenty-second, and twenty-fourth preliminary material layers 144a, 244a, and 444a and the third preliminary gate insulating layer 334a.

The thirty-first to thirty-fourth preliminary material layers 146a, 246a, 346a, and 446a may respectively be conformally formed along surfaces of the twenty-first, twenty-second, and twenty-fourth preliminary material layers 144a, 244a, and 444a and the surface of the third preliminary gate insulating layer 334a. The thirty-first to thirty-fourth preliminary material layers 146a, 246a, 346a, and 446a may include, e.g., titanium nitride, but the inventive concepts are not limited thereto.

A third mask pattern MP3 and a third photoresist pattern PR3 may be formed on the first to third regions I, II, and III. The third mask pattern MP3 and the third mask photoresist pattern PR3 may cover the thirty-first to thirty-third preliminary material layers 146a, 246a, and 346a and expose the thirty-fourth preliminary material layer 446a. The third mask pattern MP3 and the third photoresist pattern PR3 may respectively be substantially the same as the first mask pattern MP1 (see FIG. 6) and the first photoresist pattern PR1 (see FIG. 6) that are described above, except for difference in the regions that are covered and exposed.

Referring to FIG. 11, the twenty-fourth and thirty-fourth preliminary material layers 444a and 446a (see FIG. 10) may be removed using the third mask pattern MP3 (see FIG. 10) and the third photoresist pattern PR3 (see FIG. 10) as an etch mask, thus exposing the fourth preliminary gate insulating layer 434a. The third mask pattern MP3 (see FIG. 10) and the third photoresist pattern PR3 (see FIG. 10) may be removed.

The removing of the twenty-fourth and thirty-fourth preliminary material layers 444a and 446a (see FIG. 10) using the third mask pattern MP3 (see FIG. 10) and the third photoresist pattern PR3 (see FIG. 10) may be substantially the same as the removing of the twelfth and fourteenth preliminary material layers 242a and 442a (see FIG. 6) using the first mask pattern MP1 (see FIG. 6) and the first photoresist pattern PR1 (see FIG. 6) that are described above, except for difference in the removing region.

Accordingly, the first to third preliminary material layers 140a, 240a, and 340a having different thicknesses respectively formed on the first to third regions I, II, and III, and the fourth preliminary gate insulating layer 434a may be exposed on the fourth region IV. The first preliminary material layer 140a may be constituted by the eleventh preliminary material layer 142a, the twenty-first preliminary material layer 144a, and the thirty-first preliminary material layer 146a. The second preliminary material layer 240a may be constituted by the twenty-second preliminary material layer 244a and the thirty-second preliminary material layer 246a. The third preliminary material layer 340a may be constituted by the thirty-third preliminary material layer 346a.

Referring to FIG. 12, the first preliminary material layer 140a may have the first thickness T1, the second preliminary material layer 240a may have the second thickness T2, and the third preliminary material layer 340a may have the third thickness T3. The first to third thicknesses may be different from one another.

The first thickness T1 may be greater than the second thickness T2. The second thickness T2 may be greater than the third thickness T3. Additionally, a fourth preliminary material layer may not be present.

The first preliminary material layer 140a may be constituted by an upper metal layer, a lower metal layer, and a polysilicon layer between the upper metal layer and the lower metal layer. The upper metal layer may be constituted by the twenty-first preliminary material layer 144a and the thirty-first preliminary material layer 146a. The polysilicon layer may be the eleventh preliminary upper layer 143a. The lower metal layer may be the eleventh preliminary lower layer 141a.

A thickness TS of the polysilicon layer may be smaller than a thickness TT of the upper metal layer and a thickness TB of the lower metal layer TB. The thickness TT of the upper metal layer may be greater than the thickness TB of the lower metal layer.

Figure 13:
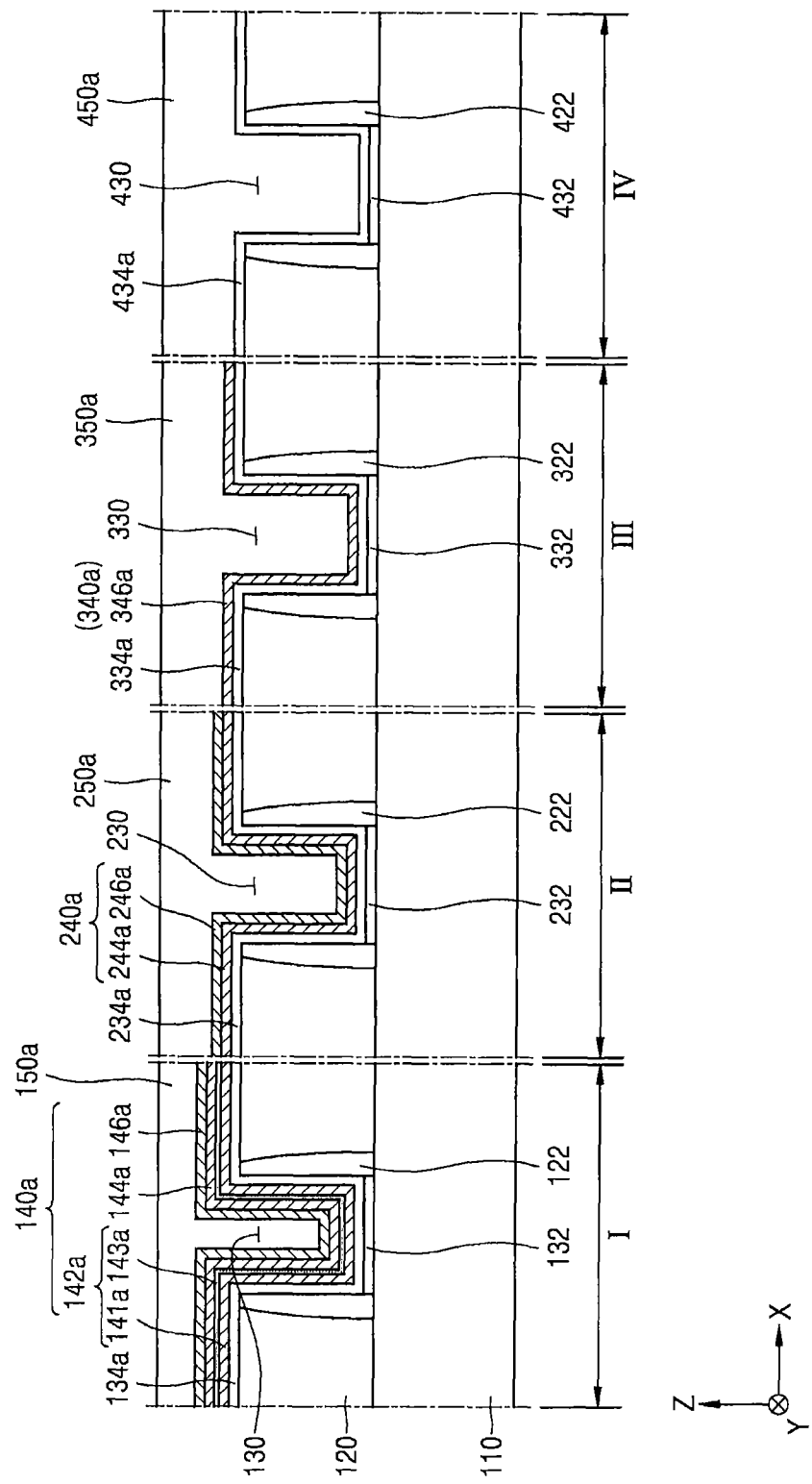

Referring to FIG. 13, first to fourth preliminary gate electrode layers 150a, 250a, 350a, and 450a respectively may be formed on the first to fourth regions I, II, III, and IV.

The formation of the first to fourth preliminary gate electrode layers 150a, 250a, 350a, and 450a may include forming first to fourth TiAlC layers, forming first to fourth barrier layers on the first to fourth TiAlC layers, respectively, and forming first to fourth gate metal layers on the first to fourth barrier layers, respectively. In FIG. 13, each of the first to fourth preliminary gate electrode layers 150a, 250a, 350a, and 450a is illustrated as having a single layer, for convenience of description, but the inventive concepts are not limited thereto.

The first to fourth preliminary gate electrode layers 150a, 250a, 350a, and 450a may respectively be within and/or fill the first to fourth trenches 130, 230, 330, and 430 and cover the thirty-first to thirty-third preliminary material layers 146a, 246a, and 346a and the fourth preliminary gate insulating layer 434a.

Next, referring again to FIG. 1, a planarization process may be performed to expose an upper surface of the interlayer insulating layer 120, thus forming the first to fourth gate structures 160, 260, 360, and 460. As a result, the first to fourth transistors TR1, TR2, TR3, and TR4 may be formed on the first to fourth regions I, II, III, and IV, respectively.

The semiconductor device 10 according to example embodiments includes the first to fourth transistors TR1, TR2, TR3, and TR4. The threshold voltages of the first to fourth transistors TR1, TR2, TR3, and TR4 may respectively be controlled depending on the thickness of each of the first to third material layers 140, 240, and 340 and the absence of a fourth material layer. Thus, the first to third material layers 140, 240, and 340 may be formed to have various thicknesses according to need.

In the method of manufacturing the semiconductor device 10 according to example embodiments of the inventive concepts, since the material used to perform another function is also used as the work function adjusting material without an additional process step, manufacturing efficiency and productivity may be increased. Additionally, since the method does not include a process of removing the relatively thick titanium nitride layers in the trenches 130, 230, 330, and 430, the degree of process difficulty may be reduced such that the manufacturing efficiency and productivity of the semiconductor device may be improved.

Figure 14:
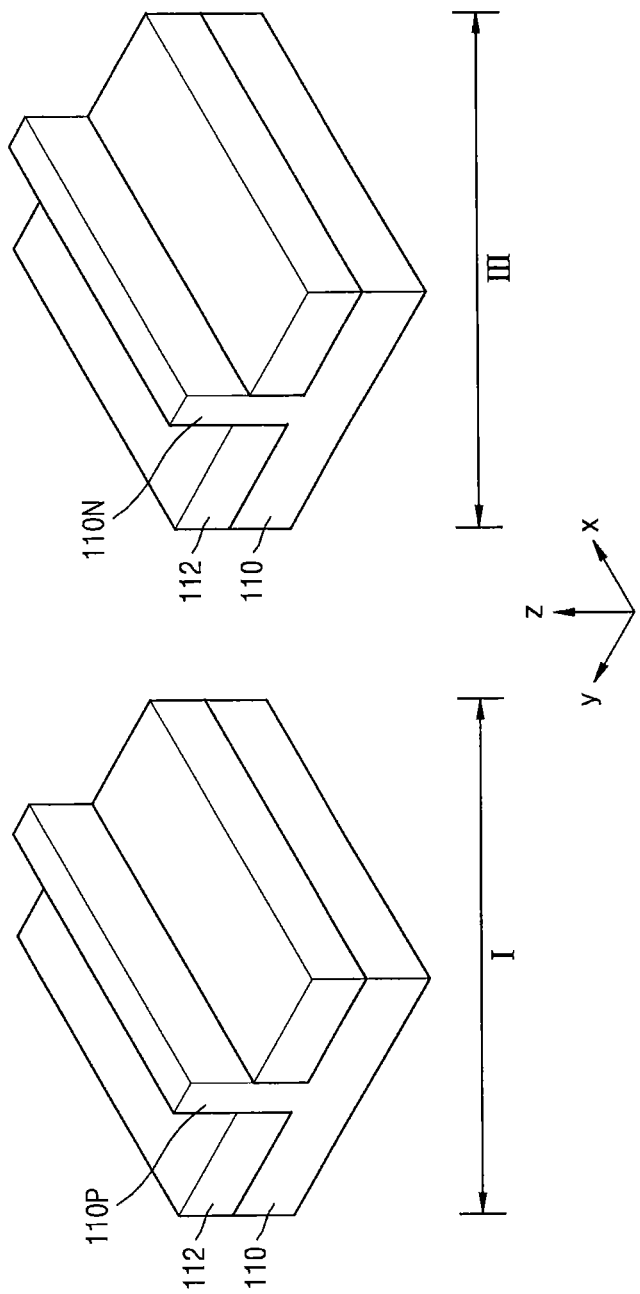
FIGS. 14 to 16 are perspective views illustrating a method of manufacturing a semiconductor device including a fin-type transistor according to example embodiments of the inventive concepts.
Figure 15:
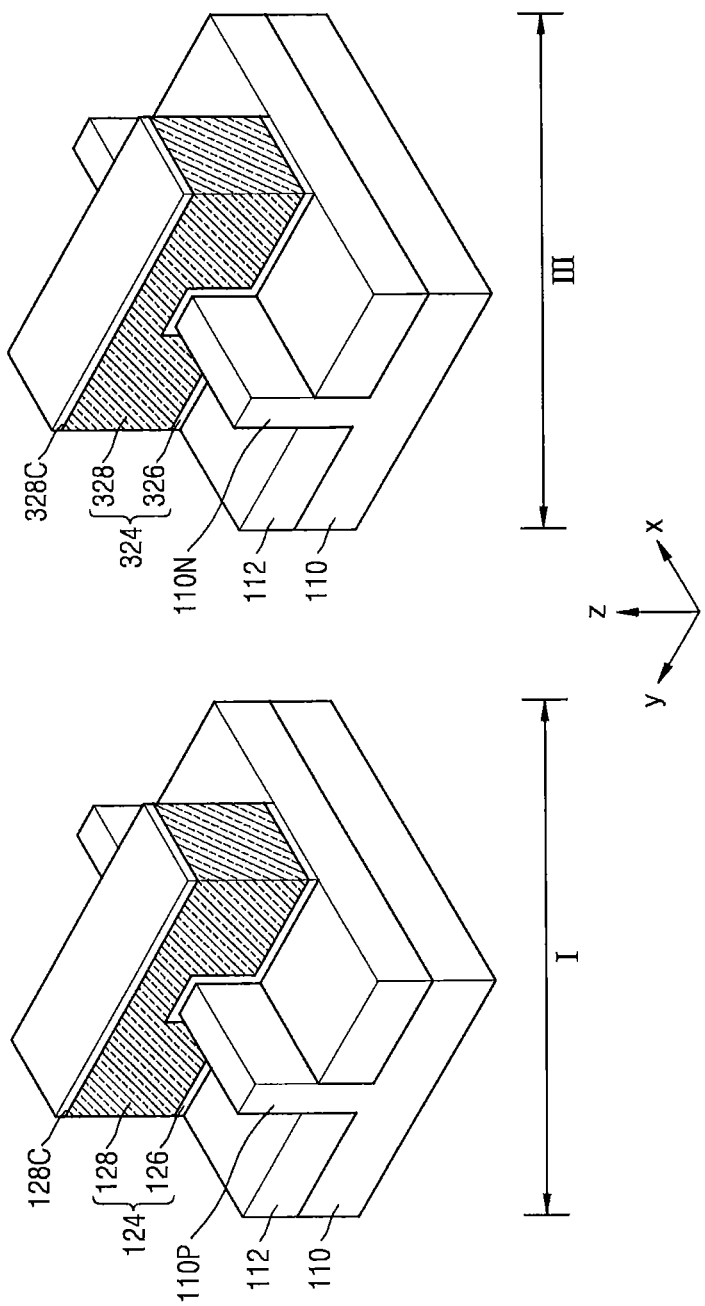
Figure 16:
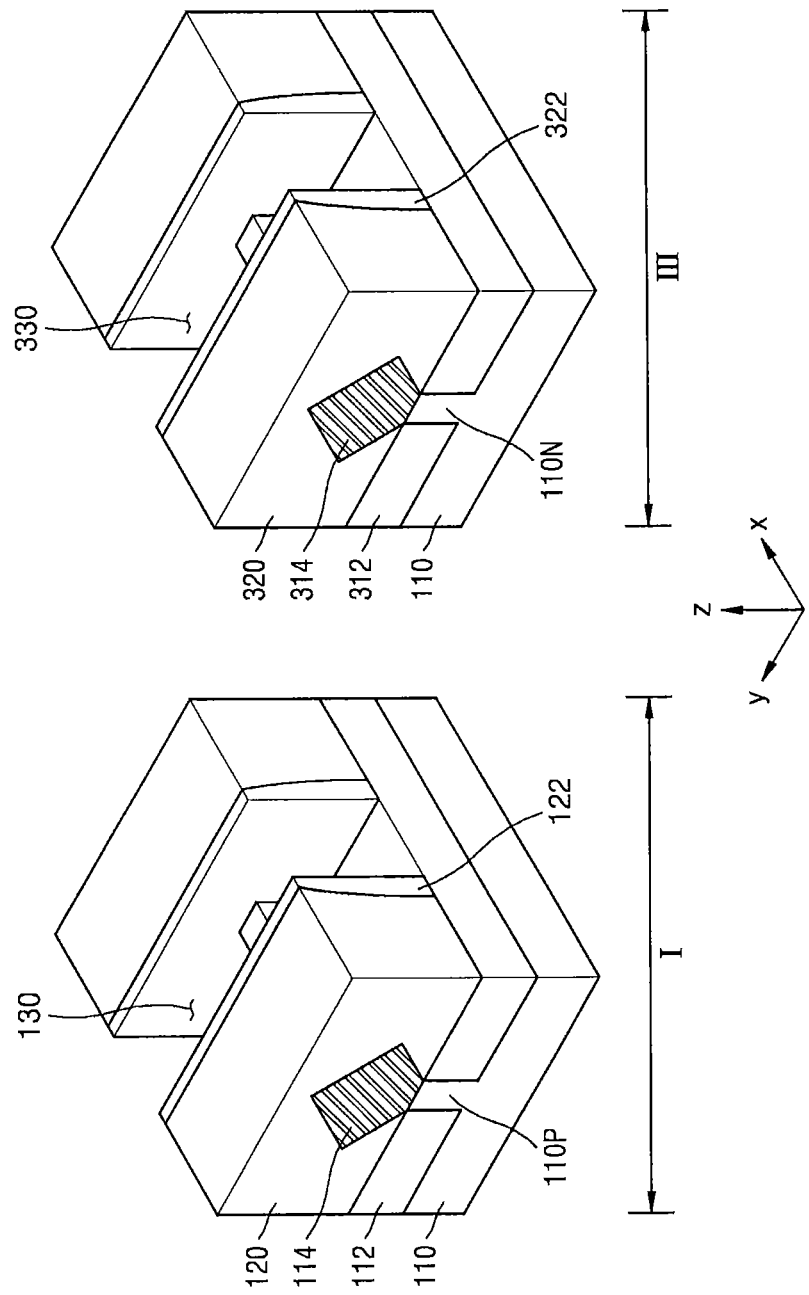

FIGS. 14 to 16 are perspective views illustrating a method of manufacturing a semiconductor device including a fin-type transistor according to example embodiments of the inventive concepts.

In FIGS. 14 to 16, the first region I refers to a PMOS region, and the third region III refers to an NMOS region. A second region II (not illustrated) may be substantially as the same as the first region I. A fourth region IV (not illustrated) may be substantially as the same as the third region III.

Referring to FIG. 14, a first fin-type active pattern 110P and a third fin-type active pattern 110N may be formed on the substrate 110. The first fin-type active pattern 110P may be formed on the first region I. The third fin-type active pattern 110N may be formed on the third region III.

The first and third fin-type active patterns 110P and 110N may extend in the first direction X. The first and third fin-type active patterns 110P and 110N may each be a portion of the substrate 110 or include an epitaxial layer grown from the substrate 110. An isolation layer 112 may be formed to cover a portion of each of the first and third fin-type active patterns 110P and 110N and be a deep trench isolation layer.

Referring to FIG. 15, a first dummy gate structure 124 and a third dummy gate structure 324 may be formed on the substrate 110. The first dummy gate structure 124 may extend in the second direction Y and intersect the first fin-type active pattern 110P. The third dummy gate structure 324 may extend in the second direction Y and intersect the third fin-type active pattern 110N.

The first dummy gate structure 124 may include a first dummy gate insulating layer 126 and a first dummy gate electrode layer 128. The third dummy gate structure 324 may include a third dummy gate insulating layer 326 and a third dummy gate electrode layer 328. When forming the first dummy gate structure 124 and the third dummy gate structure 324, a first hard mask pattern 128C and a third hard mask pattern 328C may be used as an etch mask.

Referring to FIG. 16, the first spacer 122 and the third spacer 322 are formed on sidewalls of the first dummy gate structure 124 (see FIG. 15) and the third dummy gate structure 324 (see FIG. 15), respectively. After forming the first and third spacers 122 and 322, portions of the first and third fin-type active patterns 110P and 110N which are non-overlapped with the first and third dummy gate structures 124 and 324 may be removed to form recesses.

A first source/drain region 114 and a third source/drain region 314 may be formed at opposite sides of the first dummy gate structure 124 and the third dummy gate structure 324, respectively. The first and third source/drain regions 114 and 314 may be elevated source/drain regions. In this case, each of the first and third source/drain regions 114 and 314 may include an epitaxial layer grown from the substrate 110. The first and third source/drain regions 114 and 314 may be formed by injecting impurities. For example, the first source/drain region 114 may be formed by injecting p-type impurities, and the third source/drain region 314 may be formed by injecting n-type impurities.

A preliminary interlayer insulating layer may be formed to cover the first and third fin-type active patterns 110P and 110N, the first and third dummy gate structures 124 and 324, and the first and third source/drain regions 114 and 314. A planarization process may be performed on the preliminary interlayer insulating layer to form the interlayer insulating layer 120 exposing upper surfaces of the first and third dummy gate structures 124 and 324. The first and third dummy gate structures 124 and 324 may be removed to form the first trench 130 and the third trench 330.

Processes after the formation of the first and third trenches 130 and 330, that are substantially the same as those described with reference to FIGS. 4 to 13, may be performed. It will be understood that similar processes may also be performed with respect to similar fin-type structures in regions II and IV that are not illustrated in FIGS. 14 to 16 for ease of description.

Figure 17:
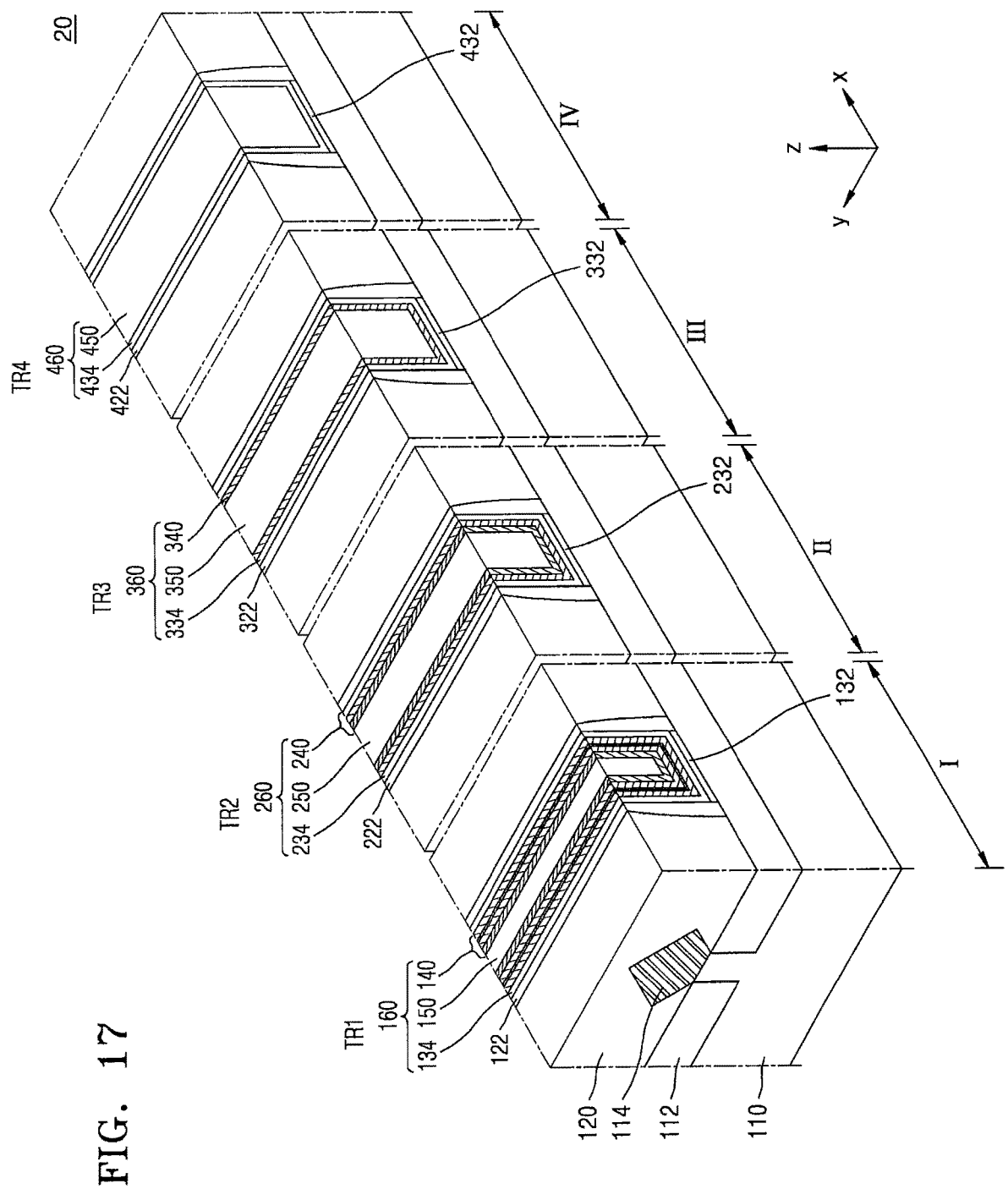
FIG. 17 is a perspective view illustrating a semiconductor device according to example embodiments of the inventive concepts.

FIG. 17 is a perspective view illustrating a semiconductor device according to example embodiments of the inventive concepts.

Referring to FIG. 17, a semiconductor device 20 includes first, second, third, and fourth fin-type transistors TR1, TR2, TR3, and TR4.

The semiconductor device 20 includes first to fourth fin-type transistors TR1, TR2, TR3, and TR4 formed on the first to fourth regions I, II, III, and IV, respectively. The first to fourth fin-type structures TR1, TR2, TR3, and TR4 may be isolated from one another by the isolation layer 112. The isolation layer 112 may be a deep trench isolation layer.

The first to third material layers 140, 240, and 340 may include titanium nitride as a work function adjusting material. Since the first to third material layers 140, 240, and 340 may have different thicknesses, threshold voltages Vt1, Vt2, Vt3, and Vt4 of the first to fourth fin-type transistors TR1, TR2, TR3, and TR4 may be different from one another.

The elements and/or materials of forming the semiconductor device 20 may be substantially the same as those of the semiconductor device 10 described with reference to FIG. 1.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:
1. A semiconductor device, comprising:
a substrate including a first region, a second region, a third region, and a fourth region;
a first gate structure on the first region, the first gate structure comprising a first gate insulating layer, a first material layer having a first thickness, and a first gate electrode layer;
a second gate structure on the second region, the second gate structure comprising a second gate insulating layer, a second material layer having a second thickness, and a second gate electrode layer;
a third gate structure on the third region, the third gate structure comprising a third gate insulating layer, a third material layer having a third thickness, and a third gate electrode layer; and
a fourth gate structure on the fourth region, the fourth gate structure comprising a fourth gate insulating layer and a fourth gate electrode layer,
wherein the first, second, and third thicknesses are different from one another, and
wherein the first material layer includes a lower metal layer, an upper metal layer, a polysilicon layer between the lower metal layer and the upper metal layer, and a work function adjusting layer between the upper metal layer and the first gate electrode layer.

2. The semiconductor device of claim 1, wherein, in the first material layer, a thickness of the polysilicon layer is smaller than respective thicknesses of the upper metal layer and the lower metal layer.

3. The semiconductor device of claim 1, wherein, the upper metal layer and the lower metal layer of the first material layer comprise a same material as the second and third material layers.

4. The semiconductor device of claim 3, wherein the same material is titanium nitride.

5. The semiconductor device of claim 1, wherein the lower metal layer and the polysilicon layer of the first material layer are chemically bonded.

6. The semiconductor device of claim 1, further comprising a first transistor on the first region, a second transistor on the second region, a third transistor on the third region, and a fourth transistor on the fourth region,
wherein the first transistor comprises the first gate structure,
wherein the second transistor comprises the second gate structure, wherein the third transistor comprises the third gate structure, wherein the fourth transistor comprises the fourth gate structure, and wherein the first transistor has a first threshold voltage, the second transistor has a second threshold voltage, the third transistor comprises a third threshold voltage, and the fourth transistor comprises a fourth threshold voltage, and wherein the first, second, third, and fourth threshold voltages are different from one another.

7. The semiconductor device of claim 6, wherein the first and second regions are PMOS regions, wherein the third and fourth regions are NMOS regions, wherein the first threshold voltage of the first transistor is lower than the second threshold voltage of the second transistor, and wherein the third threshold voltage of the third transistor is higher than the fourth threshold voltage of the fourth transistor.

8. The semiconductor device of claim 6, wherein the first transistor, the second transistor, the third transistor, and the fourth transistor are fin-type transistors.

9. The semiconductor device of claim 1, wherein the first thickness is greater than the second thickness, and wherein the second thickness is greater than the third thickness.

10. The semiconductor device of claim 1, wherein the second material layer comprises the upper metal layer and the work function adjusting layer, and wherein the third material layer comprises the work function adjusting layer.

11. A semiconductor device comprising:

a substrate comprising a first region, a second region, a third region, and a fourth region;

a gate insulating layer on the first region, the second region, the third region, and the fourth region;

a first work function adjusting layer and a polysilicon layer on the first region;

a second work function adjusting layer on the first and second regions;

a third work function adjusting layer on the first region, the second region, and the third region; and a gate electrode layer on the first region, the second region, the third region, and the fourth region.

12. The semiconductor device of claim 11, wherein the first work function adjusting layer, the second work function adjusting layer, and the third work function adjusting layer comprise a same material.

13. The semiconductor device of claim 11, wherein the first work function adjusting layer and the polysilicon layer are chemically bonded.

14. The semiconductor device of claim 11, wherein portions of the gate electrode layer on respective ones of the first region, the second region, the third region, and the fourth region each have different thicknesses.

15. The semiconductor device of claim 11, further comprising a first transistor on the first region, a second transistor on the second region, a third transistor on the third region, and a fourth transistor on the fourth region, wherein the first transistor comprises the gate insulating layer, the first work function adjusting layer, the polysilicon layer, the second work function adjusting layer, the third work function adjusting layer, and a first portion of the gate electrode layer, wherein the second transistor comprises the gate insulating layer, the second work function adjusting layer, the third work function adjusting layer, and a second portion of the gate electrode layer, wherein the third transistor comprises the gate insulating layer, the third work function adjusting layer, and a third portion of the gate electrode layer, wherein the fourth transistor comprises the gate insulating layer and a fourth portion of the gate electrode layer, and wherein the first transistor, the second transistor, the third transistor, and the fourth transistor have different respective threshold voltages.

16. A semiconductor device comprising:

a first transistor, a second transistor, a third transistor, and a fourth transistor that are on a substrate, wherein the first transistor, the second transistor, the third transistor, and the fourth transistor have different respective threshold voltages, wherein the first transistor comprises a first gate insulating layer, a first material layer, and a first gate electrode layer, wherein the second transistor comprises a second gate insulating layer, a second material layer, and a second gate electrode layer, wherein the second material layer is thinner than the first material layer, wherein the third transistor comprises a third gate insulating layer, a third material layer, and a third gate electrode layer, wherein the third material layer is thinner than the second material layer, wherein the fourth transistor comprises a fourth gate insulating layer and a fourth gate electrode layer, and wherein the first material layer comprises a lower metal layer, an upper metal layer, a polysilicon layer between the lower metal layer and the upper metal layer, and a work function adjusting layer on the upper metal layer between the upper metal layer and the firstgate electrode layer.

17. The semiconductor device of claim 16, wherein the lower metal layer and the polysilicon layer of the first material layer are chemically bonded.

18. The semiconductor device of claim 16, wherein, in the first material layer, the upper metal layer is thicker than the lower metal layer, and wherein the lower metal layer is thicker than the polysilicon layer.

19. The semiconductor device of claim 16, wherein the second material layer comprises the upper metal layer and the work function adjusting layer, and wherein the third material layer comprises the work function adjusting layer.

20. The semiconductor device of claim 16, wherein the upper metal layer directly contacts the polysilicon layer.

* * * * *